US011079809B2

(12) United States Patent
Morino et al.

(10) Patent No.: US 11,079,809 B2
(45) Date of Patent: Aug. 3, 2021

(54) ELECTRONIC APPARATUS

(71) Applicant: LENOVO (SINGAPORE) PTE. LTD., Singapore (SG)

(72) Inventors: Takayuki Morino, Kanagawa (JP); Masayuki Amano, Kanagawa (JP); Seita Horikoshi, Kanagawa (JP); Satoshi Seino, Tokyo (JP)

(73) Assignee: LENOVO (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 16/749,661

(22) Filed: Jan. 22, 2020

(65) Prior Publication Data

US 2020/0264672 A1 Aug. 20, 2020

(30) Foreign Application Priority Data

Feb. 18, 2019 (JP) ................ JP2019-26480

(51) Int. Cl.
*H05K 5/00* (2006.01)
*G06F 1/16* (2006.01)
*G06F 3/02* (2006.01)
*H05K 5/02* (2006.01)

(52) U.S. Cl.
CPC .......... *G06F 1/1681* (2013.01); *G06F 1/1618* (2013.01); *G06F 1/1624* (2013.01); *G06F 1/1679* (2013.01); *G06F 3/02* (2013.01); *H05K 5/0226* (2013.01)

(58) Field of Classification Search
None
See application file for complete search history.

(56) References Cited

U.S. PATENT DOCUMENTS

| 5,168,427 | A | 12/1992 | Clancy et al. |
| 6,853,543 | B1 | 2/2005 | Moore et al. |
| 8,599,546 | B2 * | 12/2013 | Nagasaki ............. G06F 1/1681 |
| | | | 361/679.27 |
| 8,711,554 | B2 * | 4/2014 | Griffin ................. G06F 1/1679 |
| | | | 361/679.27 |
| 9,696,763 | B2 * | 7/2017 | Mok .................... G06F 1/1656 |
| 10,289,176 | B1 * | 5/2019 | Chen .................... G06F 1/1656 |
| 10,429,899 | B1 * | 10/2019 | Huang .................. G06F 1/1662 |

(Continued)

FOREIGN PATENT DOCUMENTS

JP 09091058 A 4/1997
JP 2001273077 A 10/2001
(Continued)

*Primary Examiner* — Anthony Q Edwards
*Assistant Examiner* — Rashen E Morrison
(74) *Attorney, Agent, or Firm* — Antony P. Ng; Russell Ng PLLC

(57) ABSTRACT

An electronic apparatus is disclosed. The electronic apparatus includes a first chassis having a keyboard device on its top surface; a second chassis having a display on its front surface; a hinge mechanism connecting the first chassis and the second chassis; a movable plate disposed in the rear of the keyboard device on the top surface of the first chassis, and is configured to be turnable in a direction of moving its rear end up and down centering on a rotating shaft provided on its front end; and a drive mechanism that causes the movable plate to turn in conjunction with a turning motion of the first chassis and the second chassis through the hinge mechanism.

17 Claims, 20 Drawing Sheets

(56) References Cited

U.S. PATENT DOCUMENTS

| | | | |
|---|---|---|---|
| 10,520,990 B2* | 12/2019 | Chen | G06F 1/203 |
| 10,534,408 B2* | 1/2020 | Cheng | G06F 1/1616 |
| 10,627,874 B2* | 4/2020 | Lin | G06F 1/1681 |
| 10,761,571 B1* | 9/2020 | Cooper | G06F 1/1681 |
| 2004/0145862 A1* | 7/2004 | Hill | G06F 1/1667 |
| | | | 361/679.44 |
| 2008/0101003 A1 | 5/2008 | Lin | |
| 2010/0165567 A1* | 7/2010 | Shih | G06F 1/1667 |
| | | | 361/679.48 |
| 2012/0127652 A1* | 5/2012 | Lin | G06F 1/203 |
| | | | 361/679.46 |
| 2012/0275099 A1* | 11/2012 | Yamami | H04M 1/0208 |
| | | | 361/679.01 |
| 2018/0188774 A1* | 7/2018 | Ent | G06F 1/1669 |

FOREIGN PATENT DOCUMENTS

| | | |
|---|---|---|
| JP | 2004246847 A | 9/2004 |
| JP | 2004310238 A | 11/2004 |
| JP | 20110187034 A | 9/2011 |
| JP | 2015-141868 A | 8/2015 |
| JP | 2016-134051 A | 7/2016 |

* cited by examiner

ELECTRONIC APPARATUS

PRIORITY CLAIM

The present application claims benefit of priority under 35 U.S.C. §§ 120, 365 to the previously filed Japanese Patent Application No. JP2019-26480 with a priority date of Feb. 18, 2019, which is incorporated by reference herein.

TECHNICAL FIELD

The present invention relates to electronic apparatuses in general, and in particular to an electronic apparatus that is user-friendly while without impairing its external appearance.

BACKGROUND

An electronic apparatus such as a laptop personal computer (PC) generally includes a main body chassis equipped with a keyboard device and a display chassis equipped with a display, and the main body chassis and display chassis are connected to each other by a hinge mechanism.

Incidentally, it is desirable that a display (a main display) allow a user to do work or something using its display screen to the maximum extent possible. For a configuration in which a main body chassis is also provided with a display (a sub-display), features, such as tabs, thumbnails of applications, etc., that cannot be displayed on the main display may be displayed on the sub-display.

In general, a sub-display like the one described above does not have to be as large as a main display. Thus, a small sub-display can be installed, for example, in the rear of a keyboard device on a top surface of a main body chassis. However, with this configuration, in consideration of interference when a display chassis is closed on top of the main body chassis and the trend toward thinner electronic apparatus, the sub-display needs to be provided along the top surface of the main body chassis. Then, the small sub-display is installed flat on the back side of the top surface of the main body chassis, which is not user-friendly.

Meanwhile, on a rear end of the main body chassis, a cooling device, such as a cooling fan, may be installed. Accordingly, instead of the sub-display, a vent hole that connects inside and outside of the chassis may be provided, for example, in the rear of the keyboard device on the top surface of the main body chassis. However, with this configuration, the vent hole is widely exposed on the top surface of the main body chassis, which impairs the quality of external appearance; therefore, a better configuration that makes the vent hole unnoticeable is required.

Consequently, it would be desirable to provide an improved electronic apparatus that is user-friendly while without negatively affecting its external appearance.

SUMMARY

In accordance with an embodiment of the present disclosure, an electronic apparatus includes a first chassis having a keyboard device on its top surface; a second chassis having a display on its front surface; a hinge mechanism connecting the first chassis and the second chassis; a movable plate disposed in the rear of the keyboard device on the top surface of the first chassis, and is configured to be turnable in a direction of moving its rear end up and down centering on a rotating shaft provided on its front end; and a drive mechanism that causes the movable plate to turn in conjunction with a turning motion of the first chassis and the second chassis through the hinge mechanism.

With the above-mentioned configuration, the movable plate is caused to operate in conjunction with a turning motion of the second chassis by the drive mechanism, and its rear end moves up and down. Accordingly, when using the electronic apparatus, a user only has to open the second chassis and set the keyboard device and the display into a usable state, and the movable plate is automatically opened and adopts a front-down inclined posture. Thus, when a sub-display is provided, for example, on the top surface of the movable plate, the user can use the keyboard device and have a good view of the sub-display in the rear of the keyboard device, and also can make a touch operation easily. Furthermore, when a vent hole of a cooling device housed in the first chassis is provided, for example, under the movable plate, the movable plate is automatically opened when the electronic apparatus is used, and the vent hole becomes open. At that time, the vent hole is located on the back side of the movable plate, and therefore is hardly recognized visually by the user who uses the electronic apparatus.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

I. Description of Electronic Apparatus According to First Embodiment

Figure 1:
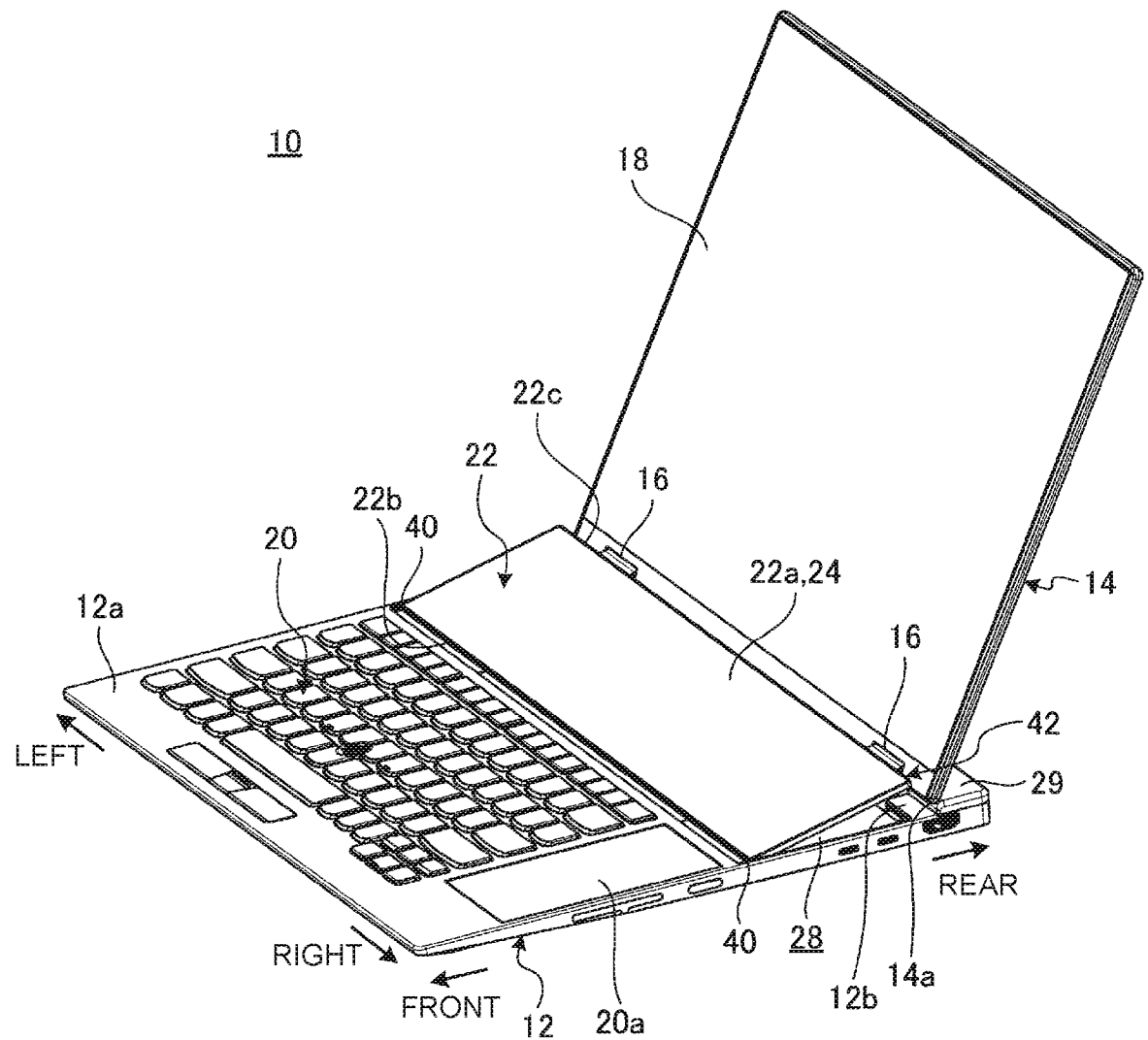
FIG. 1 is a perspective view of an electronic apparatus, according to a first embodiment.

FIG. 1 is a perspective view of an electronic apparatus 10 according to a first embodiment. As shown in FIG. 1, the electronic apparatus 10 is a laptop PC in which a main body chassis 12 and a display chassis 14 are turnably connected by a pair of right and left hinge mechanisms 16 and 16.

Hereinafter, based on a state of the electronic apparatus 10 where the display chassis 14 is open with respect to the main body chassis 12 and is in a usable form as shown in FIG. 1, as for the direction of viewed from a user who operates a keyboard device 20 while seeing a display 18, the front side is referred to as front; the back side is referred to as rear; a thickness direction of the main body chassis 12 is referred to as top-bottom; and a width direction is referred to as right-left. The same applies to electronic apparatuses 10A to 10D to be described later.

The display chassis 14 is a thin box-like chassis, and includes the display 18 including, for example, a liquid crystal display. The display 18 is a main display of the electronic apparatus 10.

The main body chassis 12 is a thin box-like chassis that is thicker than the display chassis 14. Inside the main body chassis 12, although not shown, a circuit board, a CPU, a memory, a battery device, etc. are housed. On a top surface 12a of the main body chassis 12, the keyboard device 20 and a movable plate 22 are provided. The keyboard device 20 may be a software type displayed on a touch-screen display (not shown), instead of a mechanical type shown in FIG. 1 that causes multiple keytops to move up and down. A reference numeral 20a in FIG. 1 denotes, for example, a numeric keypad or a touchpad that constitutes part of the keyboard device 20. The numeric keypad (or touchpad) 20a may be omitted. The movable plate 22 is a plate-like member that is provided alongside in the rear of the keyboard device 20 and is provided to be able to turn with respect to the main body chassis 12. The movable plate 22 in the present embodiment includes a sub-display 24 on a top surface thereof, and, as will be described in detail later, is configured to serve as an openable lid of a vent hole 26 (see FIG. 3) provided beneath.

The main body chassis 12 in the present embodiment has stepped portions 12b in the rear of the movable plate 22 on the top surface 12a. Each hinge mechanism 16 is provided on the stepped portion 12b, and connects between the main body chassis 12 and a lower end 14a of the display chassis 14.

Figure 2A:
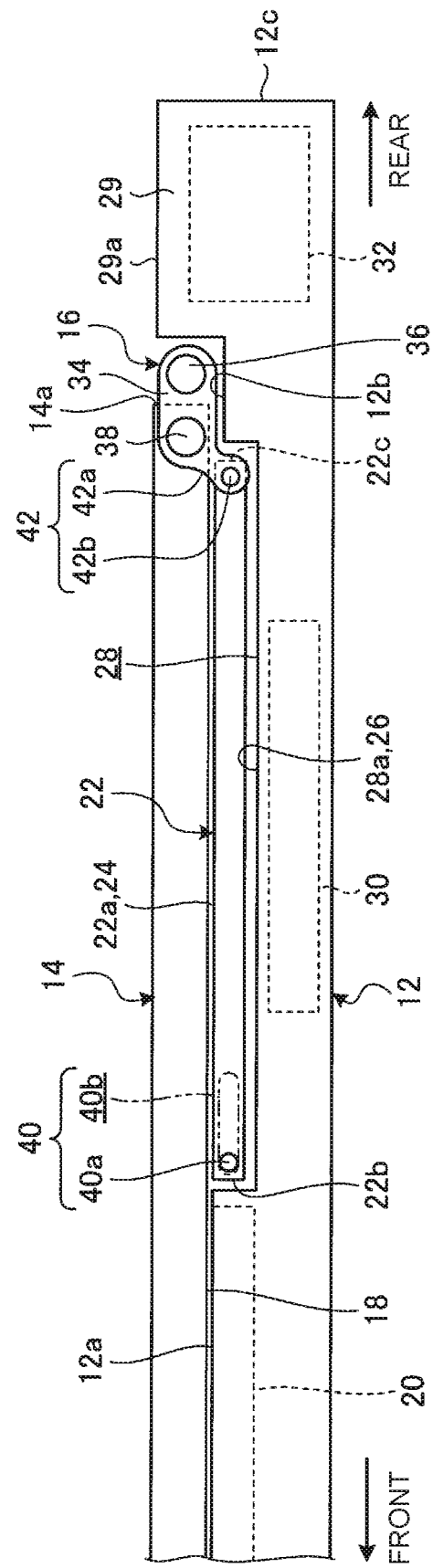
FIG. 2A is a side view showing a display chassis of the electronic apparatus from FIG. 1 is in a 0-degree position.
Figure 2B:
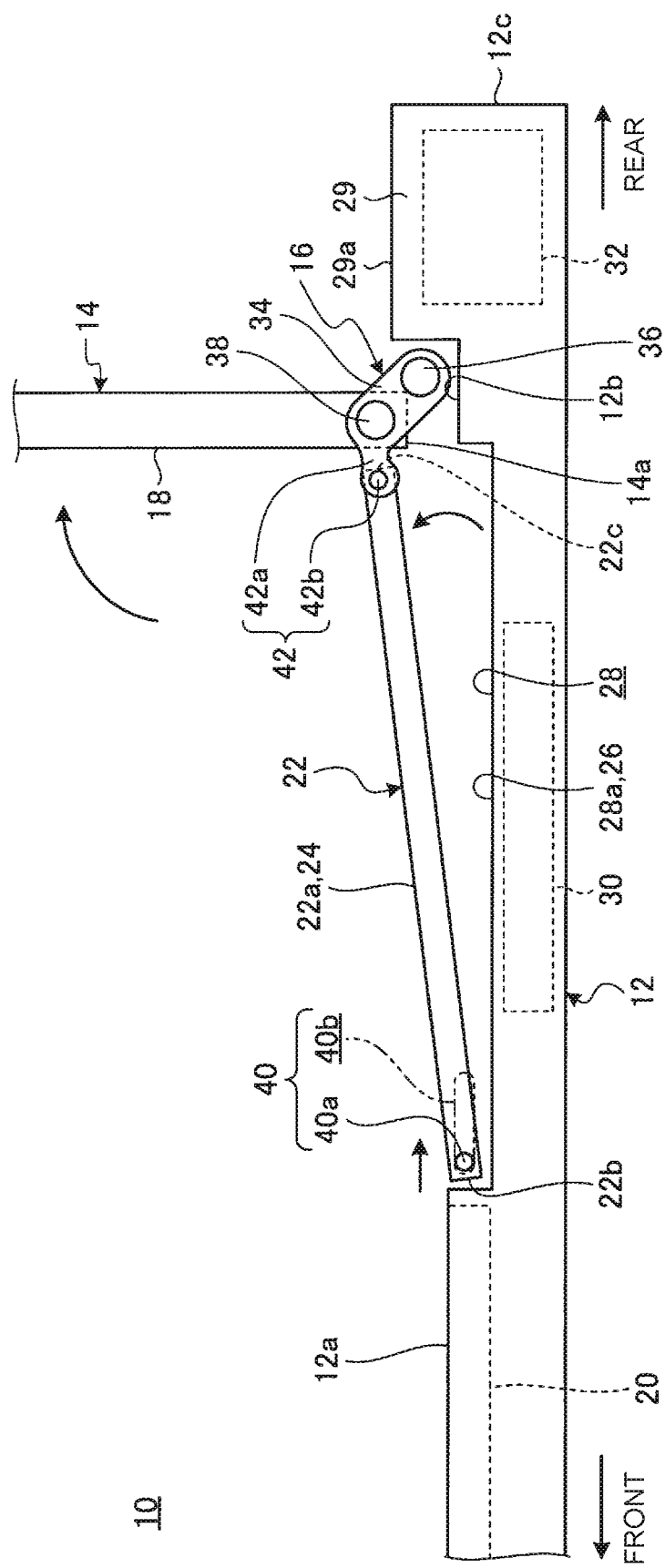
FIG. 2B is a side view showing the display chassis shown in FIG. 2A being in a 90-degree position.
Figure 2C:
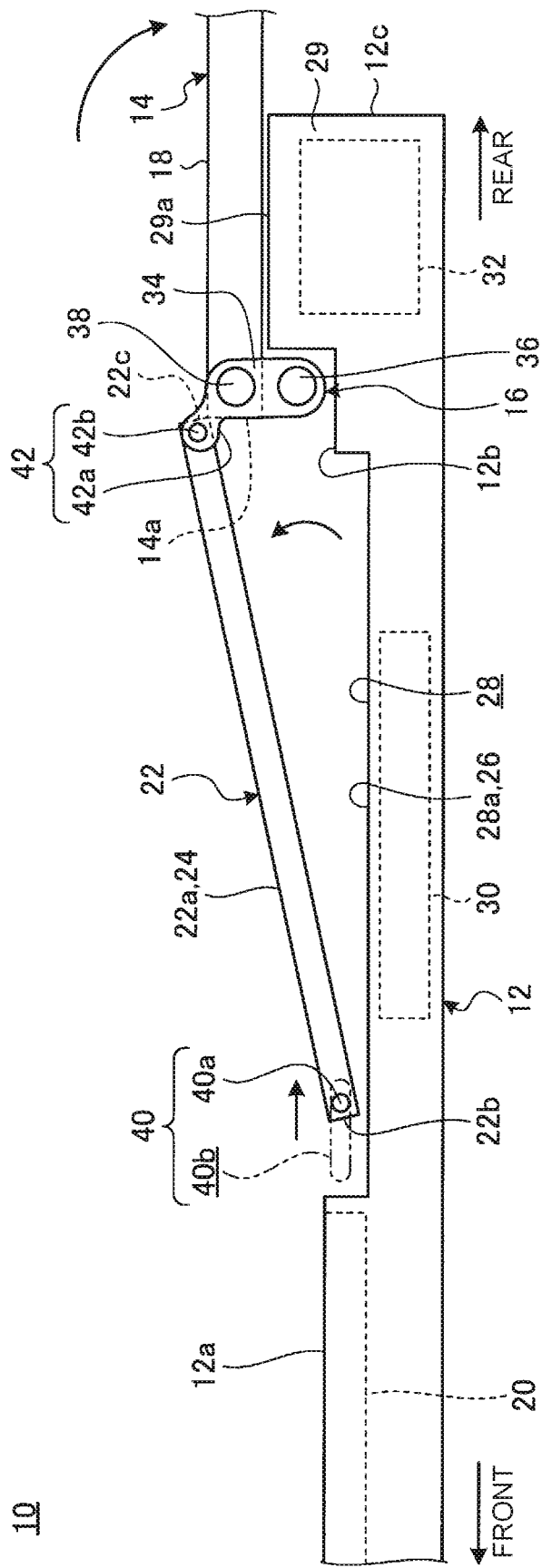
FIG. 2C is a side view showing the display chassis shown in FIG. 2B being in a 180-degree position.
Figure 3:
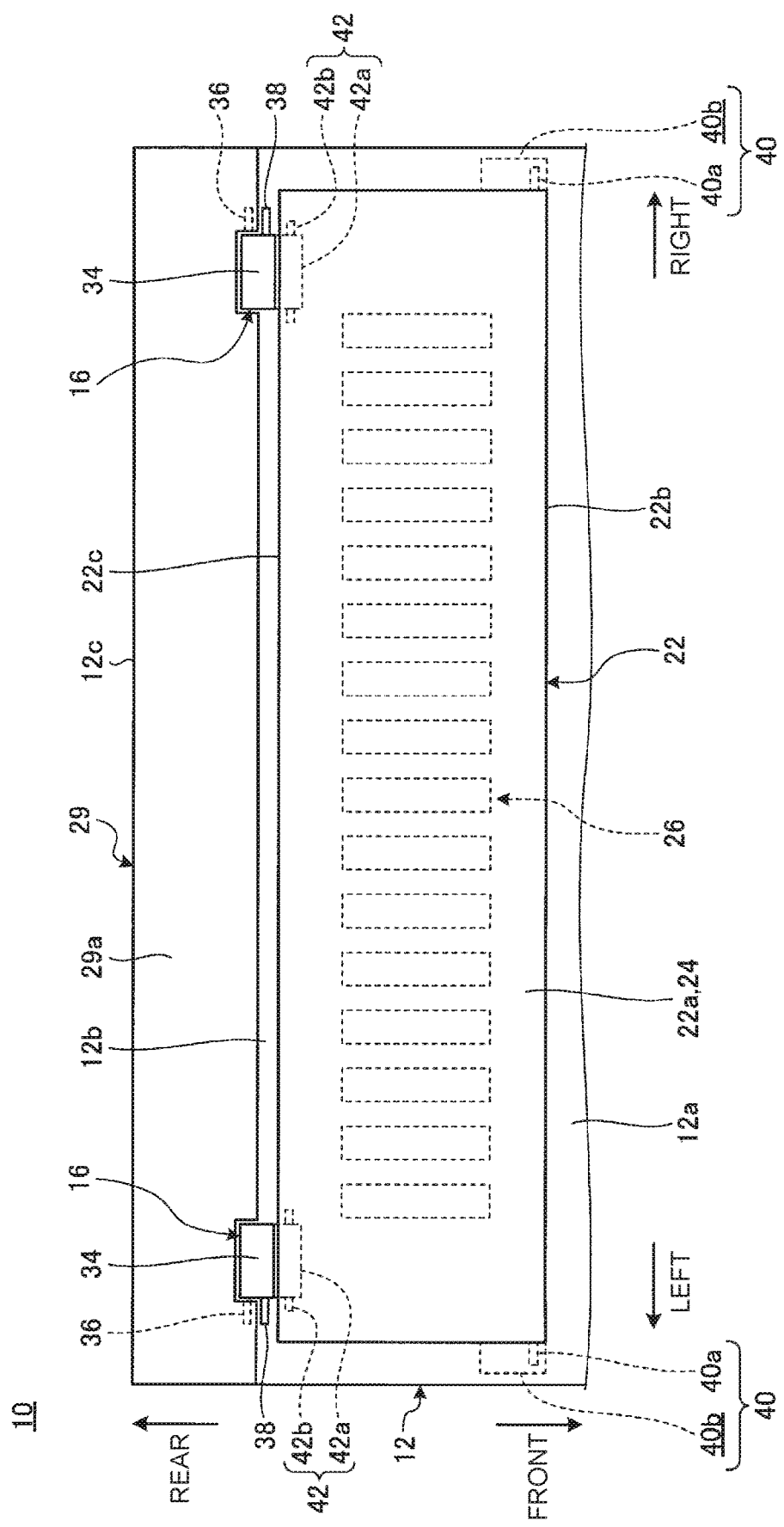
FIG. 3 is a plan view of a movable plate and its surroundings of the electronic apparatus shown in FIG. 1.

FIGS. 2A to 2C are side views schematically showing the opening/closing motion of the display chassis 14 and the movable plate 22 with respect to the main body chassis 12 in the electronic apparatus 10 shown in FIG. 1. FIG. 3 is a schematic plan view of the movable plate 22 and its surroundings of the electronic apparatus 10 shown in FIG. 1. In FIGS. 2A to 2C, to ensure the simplicity of the drawing, hatching indicating a cross section, etc. is omitted; the same applies to FIG. 4A, etc. to be described later. FIG. 3 is a plan view in a state where the display chassis 14 is closed as shown in FIG. 2A, and an illustration of the display chassis 14 is omitted; the same applies to FIG. 7, etc. to be described later.

As shown in FIGS. 2A to 3, on the top surface 12a of the main body chassis 12, a storage recessed portion 28 and the stepped portions 12b are provided in this order in the rear of the keyboard device 20. Furthermore, the main body chassis 12 has an extended portion 29 provided in the rear of the stepped portions 12b so as to project to the rear further than the hinge mechanisms 16. The main body chassis 12 may be configured to be not provided with the extended portion 29.

The storage recessed portion 28 is a shallow bathtub-like recessed portion that is a recess made in a portion of the top surface 12a, and can house the movable plate 22 being in a closed position shown in FIG. 2A. In a state where the movable plate 22 is housed in the storage recessed portion 28, a top surface 22a (the sub-display 24) of the movable plate 22 is on the same level as or in a position slightly lower than the top surface 12a of the main body chassis 12.

The main body chassis 12 is provided with a blower fan 30 below the storage recessed portion 28, and a fin 32 is provided in the extended portion 29. The fin 32 is connected to a heat-generating body, such as the CPU, for example, through a heat pipe (not shown). The blower fan 30 takes the outside air into the main body chassis 12 through the vent hole 26 provided on a top surface 28a of the storage recessed portion 28, and discharges it from an air outlet (not shown) provided on a rear surface 12c of the main body chassis 12 through the fin 32. The vent hole 26 is, for example, as shown by a broken line in FIG. 3, configured of a plurality of slits that extends in a front-rear direction and is aligned in a right-left direction.

As shown in FIGS. 2A to 3, the hinge mechanism 16 includes a hinge chassis 34, a main body shaft 36, and a display shaft 38. FIG. 3 shows an example where the right and left hinge mechanisms 16 are configured to have a bilaterally symmetrical structure; however, the right and left hinge mechanisms 16 may have the same structure.

The hinge chassis 34 is a rectangular tube-like member provided to stretch between the main body chassis 12 and the display chassis 14. The main body shaft 36 is a shaft that relatively rotatably connects between the main body chassis 12 and the hinge chassis 34. One end of the main body shaft 36 is unrotatably connected to the main body chassis 12, and the other end is rotatably supported by the hinge chassis 34. One end of the main body shaft 36 may be rotatably supported by the main body chassis 12, and the other end may be unrotatably connected to the hinge chassis 34. The display shaft 38 is a shaft that relatively rotatably connects between the display chassis 14 and the hinge chassis 34. One end of the display shaft 38 is unrotatably connected to the display chassis 14, and the other end is rotatably supported by the hinge chassis 34. One end of the display shaft 38 may be rotatably supported by the display chassis 14, and the other end may be unrotatably connected to the hinge chassis 34.

In this way, the hinge mechanism 16 has a two-axis structure including the main body shaft 36 and the display shaft 38 that are two hinge axes. In the hinge mechanism 16, the main body shaft 36 and the display shaft 38 rotate synchronously through a gear mechanism (not shown). That is, a turning angle of the display chassis 14 is the sum of respective rotation angles of the main body shaft 36 and the display shaft 38. Thus, the hinge chassis 34 turns only by half the turning angle of the display chassis 14. Specifically, if the display chassis 14 turns from a 0-degree position shown in FIG. 2A to a 90-degree position shown in FIG. 2B, the hinge chassis 34 turns from the 0-degree position to a 45-degree position.

The main body shaft 36 is connected to the stepped portion 12b of the main body chassis 12, and is disposed lower than a top surface 29a of the extended portion 29. With a turning motion of the hinge chassis 34, the display shaft 38 moves from a position lower than the top surface 29a (see FIG. 2A) to a position higher than the top surface 29a (see FIGS. 2B and 2C).

Therefore, in a case where the display chassis 14 is in the 0-degree position (see FIG. 2A), the shafts 36 and 38 of the hinge mechanism 16 are aligned in the front-rear direction, and the hinge chassis 34 adopts a 0-degree posture in which it is housed in the stepped portion 12b. In a case where the display chassis 14 is in the 90-degree position (see FIG. 2B), the shafts 36 and 38 of the hinge mechanism 16 are aligned in a posture inclined at 45 degrees to a top-bottom direction, and thus the hinge chassis 34 adopts a 45-degree posture, and the display shaft 38 projects upward further than the top surface 29a. In a case where the display chassis 14 is in a 180-degree position (see FIG. 2C), the shafts 36 and 38 of the hinge mechanism 16 are aligned in the top-bottom direction, and thus the hinge chassis 34 stands in a 90-degree posture. Therefore, in the 180-degree position, the display shaft 38 is entirely located higher than the top surface 29a, and the display chassis 14 is smoothly turned onto the top surface 29a. It is to be noted that in the present embodiment, for convenience' sake, the angular position of the display chassis 14 is referred to as 0-degree position (0-degree posture), 90-degree position (45-degree posture), or 180-degree position (90-degree posture); however, naturally, it may deviate more or less from an exact angular position indicated by a numerical value of the angle depending on the structure of the main body chassis 12, the display chassis 14, or the hinge mechanism 16.

As shown in FIGS. 1 to 3, the movable plate 22 is a plate-like member that can turn to a direction in which a rear end 22c makes an up-and-down motion centering on a rotating shaft 40 provided on a front end 22b. The movable plate 22 includes the sub-display 24 on the top surface 22a. The sub-display 24 is, for example, a touch-screen liquid crystal display. A turning motion of the display chassis 14 is transmitted to the movable plate 22 through a drive mechanism 42, and thus the movable plate 22 turns in conjunction with the turning motion of the display chassis 14.

The rotating shaft 40 connects between the front end 22b of the movable plate 22 and the main body chassis 12 so that the movable plate 22 can rotate and slide in the front-rear direction. The rotating shaft 40 has connecting shafts 40a provided on right and left side surfaces of the front end 22b of the movable plate 22 in a projecting manner and slide support portions 40b that support the respective connecting shafts 40a so that the connecting shafts 40a can slide in the front-rear direction. The connecting shaft 40a is a pin-like member. The slide support portion 40b is a long hole formed on right and left inner wall surfaces of the storage recessed portion 28 and in which the connecting shaft 40a can slide along the front-rear direction. It may be configured that the connecting shafts 40a are provided on the main body chassis 12 side, and the slide support portions 40b are provided on the movable plate 22 side.

The drive mechanism 42 is a mechanism that causes the movable plate 22 to turn in conjunction with a turning motion of the display chassis 14 by means of the hinge mechanisms 16. The drive mechanism 42 has a bridge portion 42a and a drive shaft 42b. In the present embodiment, there is provided an example of a configuration where the right and left hinge mechanisms 16 are each provided with the drive mechanism 42 (see FIG. 3); however, the drive mechanism 42 may be provided only in either one of the right and left hinge mechanisms 16. However, the turning motion and the stability of the movable plate 22 improve if the right and left hinge mechanisms 16 are both provided with the drive mechanism 42.

The bridge portion 42a is a projecting piece that projects from an external surface of the hinge chassis 34, and connects between the rear end 22c of the movable plate 22 and the hinge chassis 34. The bridge portion 42a is provided so as to project near the display shaft 38 in the hinge chassis 34. The bridge portion 42a projects in a direction in which a straight line connecting between the shaft center of the main body shaft 36 and the shaft center of the display shaft 38 is bent about 45 degrees from the display shaft 38. For example, in the 0-degree position shown in FIG. 2A, the bridge portion 42a projects forward and obliquely downward at an angle of 45 degrees with respect to the display shaft 38.

The drive shaft 42b is a shaft that relatively rotatably connects between a distal end of the bridge portion 42a and the rear end 22c of the movable plate 22. The display shaft 38 is disposed in a position between the drive shaft 42b and the main body shaft 36. A straight line connecting the respective shaft centers of the shafts 36, 38, and 42b in this order forms a substantially boomerang shape.

Subsequently, the operation of the electronic apparatus 10 according to the present embodiment is described.

First, in the 0-degree position in which the display chassis 14 is closed on the top surface 12a of the main body chassis 12, as shown in FIG. 2A, the main body shaft 36 and the display shaft 38 are aligned in the front-rear direction, and the hinge chassis 34 adopts the 0-degree posture, i.e., the hinge chassis 34 lies down. In this state, the bridge portion 42a projects forward and obliquely downward, and the drive shaft 42b on its distal end is located inside the storage recessed portion 28. The connecting shaft 40a is located at the most forward position in the slide support portion 40b. Thus, the movable plate 22 is housed in the storage recessed portion 28 in a horizontal posture along the front-rear direction, and does not interfere with a closing motion of the display chassis 14. Therefore, the electronic apparatus 10 is in the shape of a thin plate, where portions from the top surface 29a of the extended portion 29 to the back (here, the top surface) of the display chassis 14 are substantially on the same level.

If the display chassis 14 is turned from the 0-degree position in an opening direction, the hinge chassis 34 turns by a turning angle that is half the turning angle of the display chassis 14. At this time, the hinge chassis 34 turns around the main body shaft 36 as the turning center, and thus the bridge portion 42a makes a turning movement around the main body shaft 36 as the center. Therefore, the drive shaft 42b also makes a turning movement around the main body shaft 36 as the center, and pulls the rear end 22c of the movable plate 22 rearward while drawing it upward.

If the display chassis 14 comes in the 90-degree position shown in FIG. 2B, the hinge chassis 34 adopts the 45-degree posture, i.e., the hinge chassis 34 faces forward and obliquely upward from the main body shaft 36. Therefore, the movable plate 22 adopts a front-down inclined posture with the rear end 22c moved upward centering on the connecting shaft 40a in the front end 22b (see FIG. 2B).

If the display chassis 14 is further turned from the 90-degree position in the opening direction, the hinge chassis 34 also further turns in a direction of lifting up the display shaft 38. For example, when the display chassis 14 is set at about 120 degrees that is a general angular position when a laptop PC is used, the rear end 22c is lifted up further and, at the same time, the movable plate 22 moves further rearward than those in the 90-degree position.

If the display chassis 14 comes in the 180-degree position shown in FIG. 2C, the hinge chassis 34 adopts the 90-degree posture with the main body shaft 36 as the turning center. Thus, the rear end 22c is lifted up to the highest, and the movable plate 22 is in a position slid to the most rear.

In this way, the electronic apparatus 10 includes the drive mechanism 42, and thus the movable plate 22 turns in conjunction with the turning motion of the display chassis 14. That is, if a user opens the display chassis 14 up to his/her desired angular position when using the electronic apparatus 10, the movable plate 22 is automatically open and adopts the front-down inclined posture. Thus, while using the keyboard device 20, the user can have a good view of the sub-display 24 in the rear of the keyboard device 20, and also can make a touch operation easily (see also FIG. 1). Furthermore, in this state, the vent hole 26 is open. Thus, the blower fan 30 can efficiency take in the outside air through the vent hole 26, and the cooling efficiency of the electronic apparatus 10 is improved. At this time, the vent hole 26 is located on the back side of the movable plate 22, and therefore is hardly recognized visually by the user who uses the electronic apparatus 10 (see FIG. 1), and the quality of external appearance is not impaired. Moreover, the movable plate 22 gradually slides rearward while turning in the opening direction. Thus, even in a case where the movable plate 22 is open, a gap between the rear end 22c of the movable plate 22 and a front surface of the display chassis 14 is not enlarged, and the reduction in the quality of external appearance can be suppressed further.

Furthermore, in the hinge mechanism 16 and the drive mechanism 42 in the present embodiment, the hinge chassis 34 turns by a turning angle that is half the turning angle of the display chassis 14, and the movable plate 22 is lifted up by using this turning motion of the hinge chassis 34. That is, the electronic apparatus 10 includes a time lag mechanism that causes the movable plate 22 to turn with a delay from the start of a turning motion of the display chassis 14. Accordingly, it is possible to prevent a situation where the movable plate 22 is lifted up by a large turning angle before the display chassis 14 is lifted up, and thus the rear end 22c of the movable plate 22 interferes with the display chassis 14, and the display chassis 14 cannot make a turning motion smoothly.

It is to be noted that the motion when the display chassis 14 being in the 180-degree position shown in FIG. 2C is turned in a closing direction is the opposite way around to the above-described opening motion. That is, with turning of the display chassis 14 in the closing direction, the movable plate 22 gradually moves forward while the rear end 22c goes down. Then, when the display chassis 14 comes to the 0-degree position, the electronic apparatus 10 is again back to an initial state shown in FIG. 2A.

II. Description of First Modification Example of First Embodiment

Figure 4A:
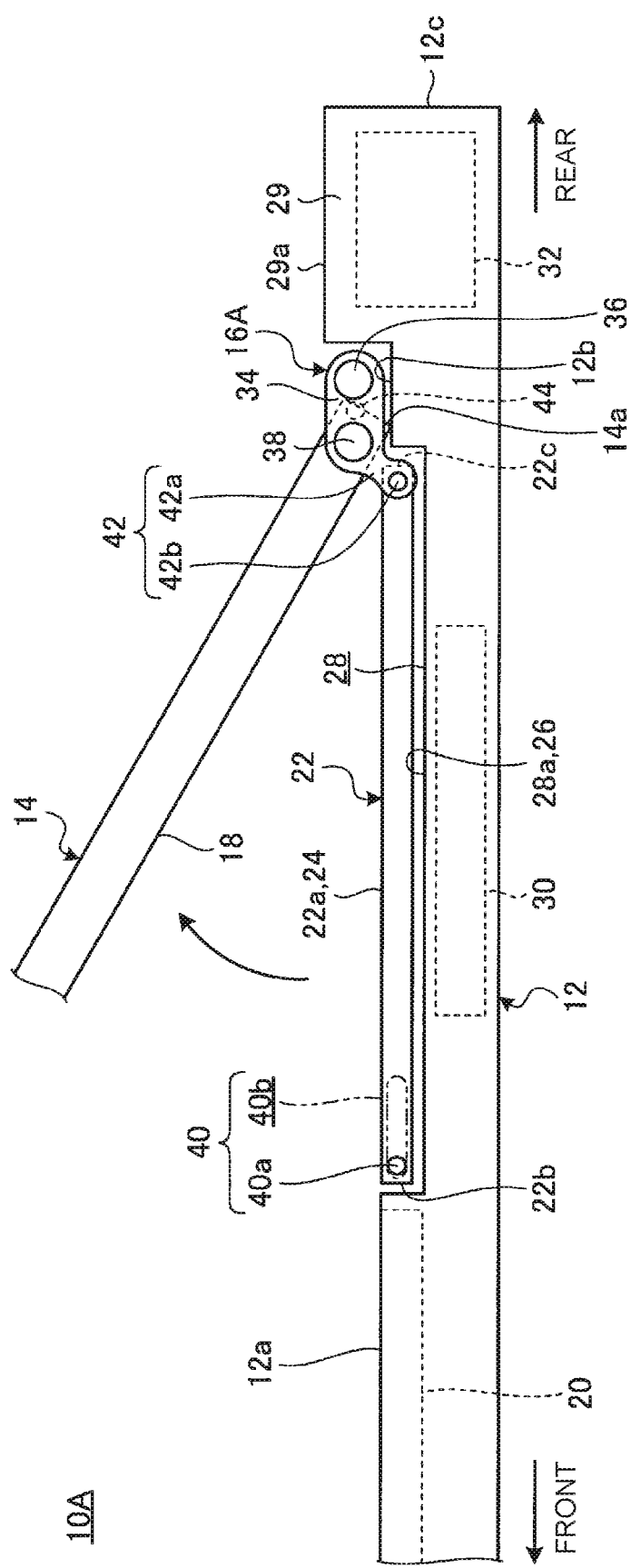
FIG. 4A is a side view showing a state where a display chassis of an electronic apparatus according to a first modification example is in a 30-degree position.
Figure 4B:
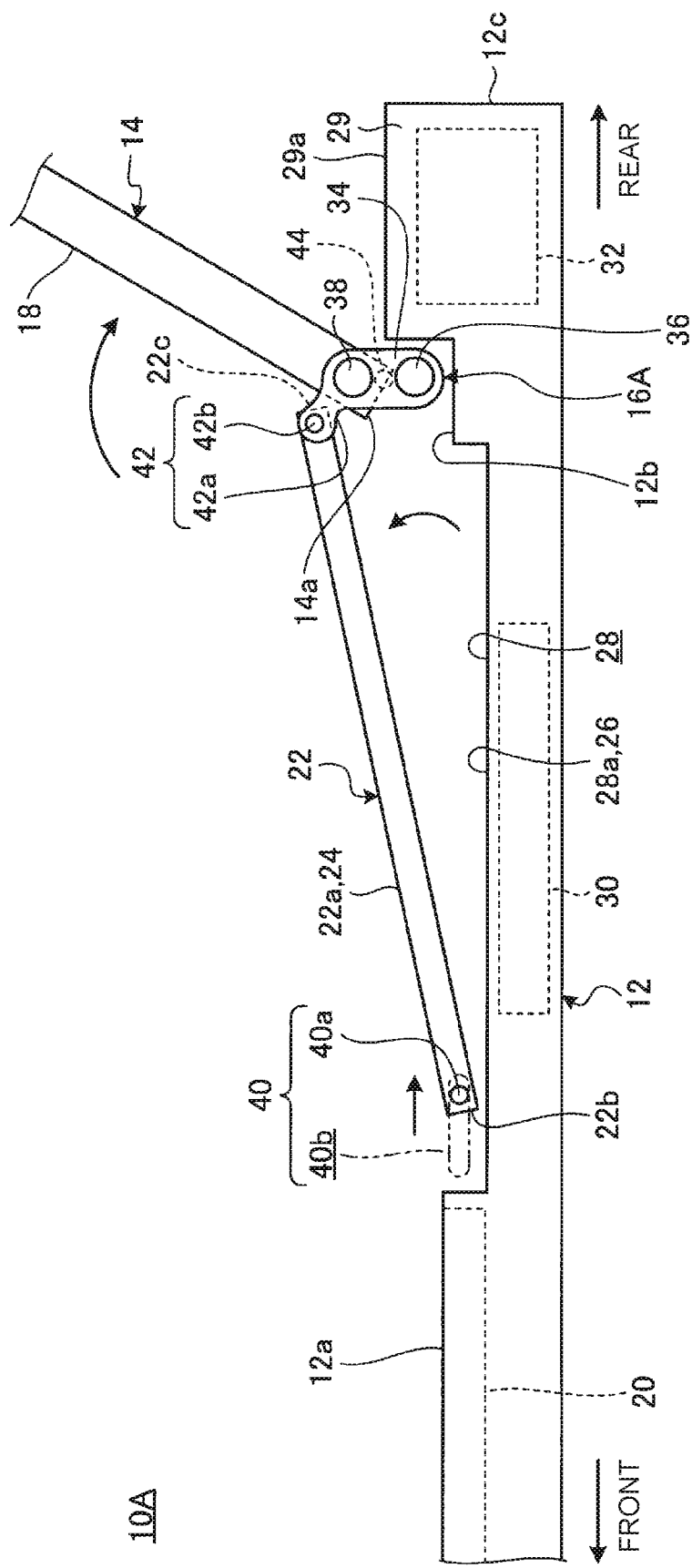
FIG. 4B is a side view showing a state where the display chassis shown in FIG. 4A is in a 120-degree position.

FIGS. 4A and 4B are side views schematically showing the opening/closing motion of the display chassis 14 and the movable plate 22 with respect to the main body chassis 12 in the electronic apparatus 10A according to a first modification example. FIG. 4A shows a state where the display chassis 14 is in a 30-degree position. FIG. 4B shows a state where the display chassis 14 is in a 120-degree position. It is to be noted that this electronic apparatus 10A is, when the display chassis 14 is in the 0-degree position, in a state similar to the electronic apparatus 10 shown in FIG. 2A, and, when the display chassis 14 is in the 180-degree position, is in a state similar to the electronic apparatus 10 shown in FIG. 2C.

The electronic apparatus 10A shown in FIGS. 4A and 4B differs from the above-described electronic apparatus 10 in that a hinge mechanism 16A having a configuration in which either the main body shaft 36 or the display shaft 38 rotates selectively depending on the turning angle of the display chassis 14 is used instead of the hinge mechanism 16 in which the main body shaft 36 and the display shaft 38 rotate synchronously. The hinge mechanism 16A may be applied to the electronic apparatuses 10C and 10D to be described later.

The hinge mechanism 16A includes a rotating shaft selecting mechanism that causes the main body shaft 36 or the display shaft 38 to rotate with respect to each range of the turning angle of the display chassis 14. This rotating shaft selecting mechanism uses, for example, a floating pin 44 that comes and goes between the main body shaft 36 and the display shaft 38. The floating pin 44 is selectively engaged with a recessed portion (not shown) formed on an outer circumferential surface of each of the shafts 36 and 38, and thereby restricting the rotation of the engaged main body shaft 36 or display shaft 38. For example, the publicly-known configuration disclosed in Japanese Patent No. 5986156 may be applied to such a rotating shaft selecting mechanism.

In a case of the present embodiment, while the display chassis 14 is opened from the 0-degree position (see FIG. 2A) to the 30-degree position (see FIG. 4A), the floating pin 44 of the hinge mechanism 16A restricts the rotation of the main body shaft 36, and only the display shaft 38 rotates. While the display chassis 14 is further opened from the 30-degree position (see FIG. 4A) to the 120-degree position (see FIG. 4B), the floating pin 44 restricts the rotation of the display shaft 38, and only the main body shaft 36 rotates. While the display chassis 14 is further opened from the 120-degree position (see FIG. 4B) to the 180-degree position (see FIG. 2C), the floating pin 44 again restricts the rotation of the main body shaft 36, and only the display shaft 38 rotates. Such switching angular positions of the shafts 36 and 38 can be changed accordingly.

Next, the operation of the electronic apparatus 10A is described.

If the display chassis 14 is in the 0-degree position in which the display chassis 14 is closed on the top surface 12*a* of the main body chassis 12, the electronic apparatus 10A is in a state similar to the electronic apparatus 10 shown in FIG. 2A. In the electronic apparatus 10A, if the display chassis 14 is turned from the 0-degree position in the opening direction, until the display chassis 14 is in the 30-degree position shown in FIG. 4A, the main body shaft 36 does not rotate, and only the display shaft 38 rotates. Thus, during this time, the hinge chassis 34 does not turn, and the drive mechanism 42 does not operate, and thus the movable plate 22 does not turn, either.

If the display chassis 14 is further turned from the 30-degree position in the opening direction, while the display chassis 14 is opened from the 30-degree position to the 120-degree position shown in FIG. 4B, the display shaft 38 does not rotate this time, and only the main body shaft 36 rotates. Thus, during this time, the hinge chassis 34 turns, and the drive mechanism 42 operates, and thus the drive shaft 42*b* pulls the rear end 22*c* of the movable plate 22 rearward while drawing it upward. Therefore, the movable plate 22 adopts the front-down inclined posture. As a result, the visibility and the operability of the sub-display 24 are improved, and the vent hole 26 is open.

If the display chassis 14 is in the 120-degree position shown in FIG. 4B, the hinge chassis 34 adopts the 90-degree posture with the main body shaft 36 as the turning center. Thus, the rear end 22*c* is lifted up to the highest, and the movable plate 22 is in the position slid to the most rear. That is, in the electronic apparatus 10A, in the 120-degree position assumed to be the most general angular position when a laptop PC is used, the movable plate 22 is set at a largest inclined angle. As a result, there are advantages that the visibility and the operability of the sub-display 24 become best, and the open amount of the vent hole 26 becomes maximum. Needless to say, the angular position of the display chassis 14 that causes the inclined angle of the movable plate 22 to be largest can be changed accordingly, for example, may be set to, for example, the 90-degree position or the 135-degree position.

If the display chassis 14 is further turned from the 120-degree position in the opening direction, while the display chassis 14 is opened from the 120-degree position to the 180-degree position, the main body shaft 36 does not rotate, and only the display shaft 38 rotates. Thus, during this time, the hinge chassis 34 does not turn, and the drive mechanism 42 does not operate, and thus the movable plate 22 does not turn, either. Then, only the display chassis 14 turns rearward. In the 180-degree position in which the display chassis 14 is open to the maximum, the electronic apparatus 10A is in a state similar to the electronic apparatus 10 shown in FIG. 2C. It is to be noted that also in the electronic apparatus 10A, the motion when the display chassis 14 being in the 180-degree position is turned in the closing direction is the opposite way around to the above-described opening motion.

III. Description of Second Modification Example of First Embodiment

Figure 5A:
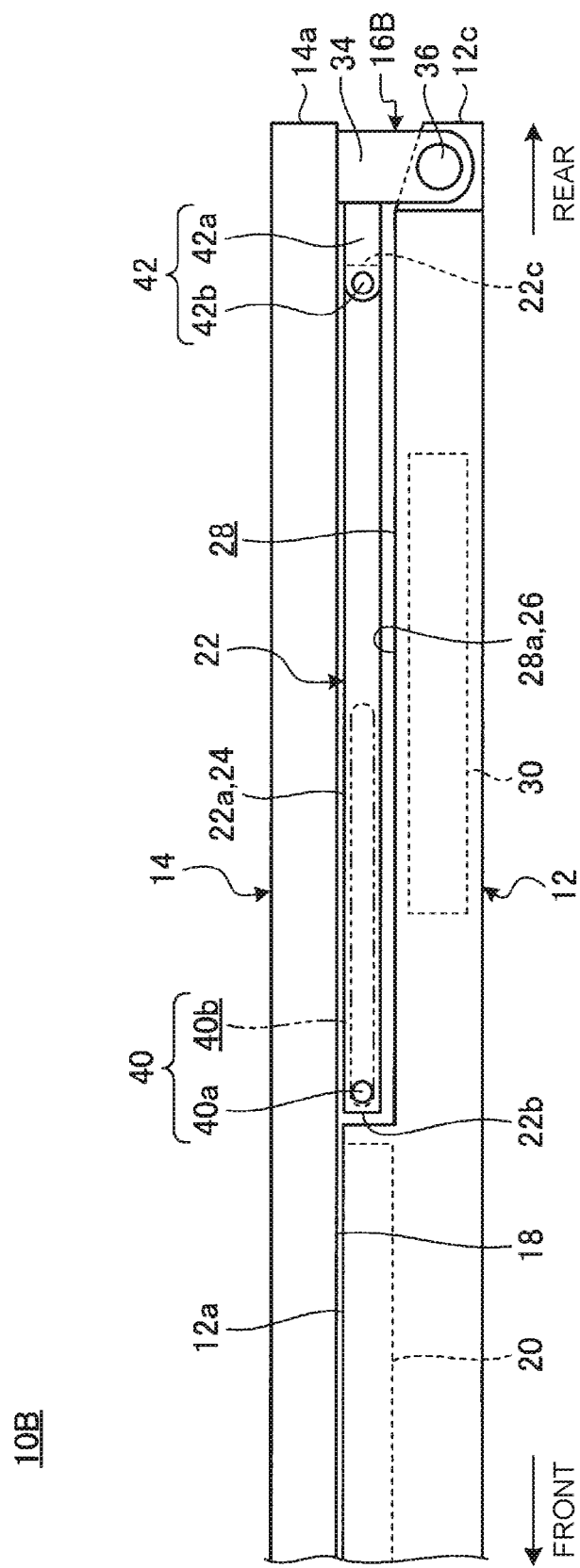
FIG. 5A is a side view showing a state where a display chassis of an electronic apparatus according to a second modification example is in the 0-degree position.
Figure 5B:
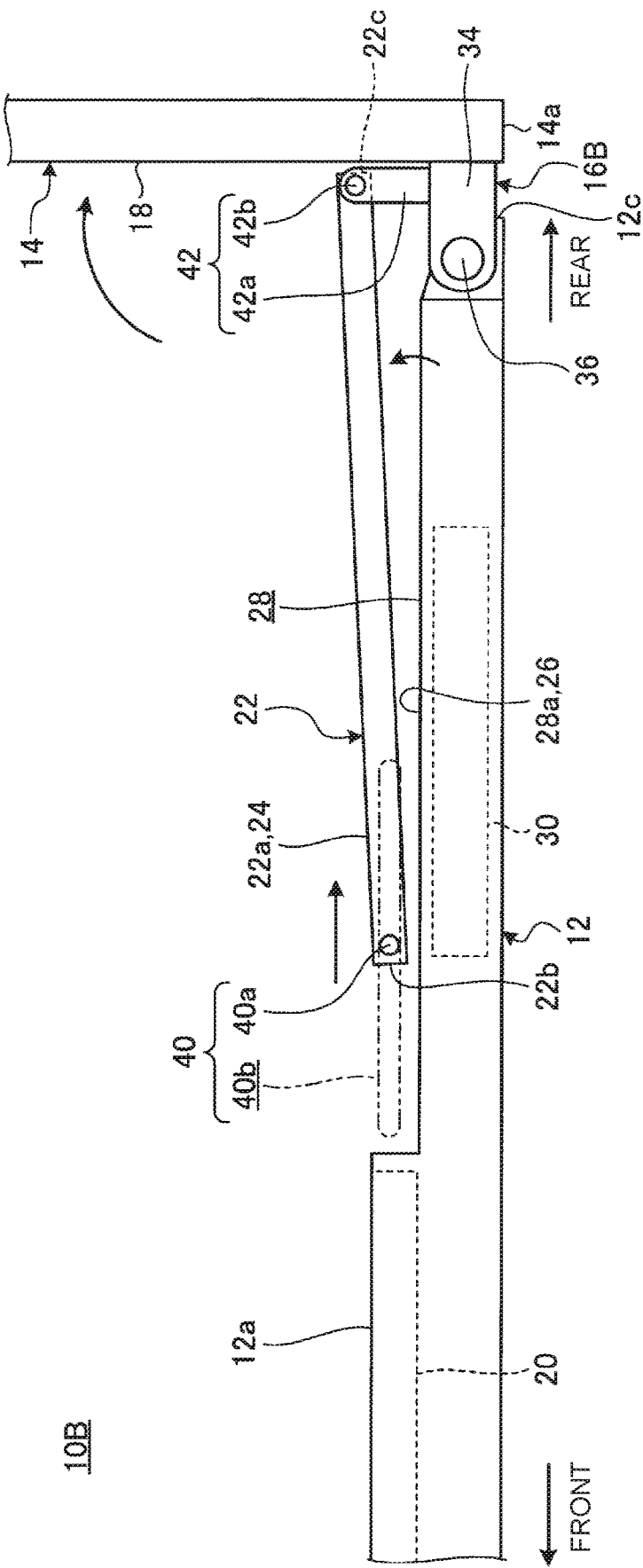
FIG. 5B is a side view showing a state where the display chassis shown in FIG. 5A is in the 90-degree position.

FIGS. 5A and 5B are side views schematically showing the opening/closing motion of the display chassis 14 and the movable plate 22 with respect to the main body chassis 12 in the electronic apparatus 10B according to a second modification example.

The electronic apparatus 10B shown in FIGS. 5A and 5B differs from the above-described electronic apparatuses 10 and 10A in that a hinge mechanism 16B of a one-axis structure including the main body shaft 36 only and not including the display shaft 38 is used instead of the hinge mechanism 16 or 16A of the two-axis structure. The hinge mechanism 16B may be applied to the electronic apparatuses 10C and 10D to be described later.

The hinge mechanism 16B includes the hinge chassis 34 and the main body shaft 36. One end of the hinge chassis 34 is rotatably provided with the main body shaft 36, and the other end is connected and fixed to a front surface of the lower end 14*a* of the display chassis 14. The bridge portion 42*a* of the drive mechanism 42 projects forward from the external surface of the hinge chassis 34, and the drive shaft 42*b* is relatively rotatably connected to the rear end 22*c* of the movable plate 22. Therefore, in the hinge mechanism 16B, if the hinge chassis 34 turns through the main body shaft 36 together with the display chassis 14, the bridge portion 42*a* turns around the main body shaft 36 as the center, which causes the movable plate 22 to be pulled rearward and lifted up. It is to be noted that the main body chassis 12 of the electronic apparatus 10B is configured to not include the extended portion 29 and the stepped portions 12*b* to avoid interference with the hinge chassis 34. Furthermore, the storage recessed portion 28 is in the shape of a dustpan whose rear end is open to the rear surface 12*c*.

Also in such an electronic apparatus 10B, if the display chassis 14 makes an opening motion, for example, from the 0-degree position shown in FIG. 5A to the 90-degree position shown in FIG. 5B, the rear end 22*c* of the movable plate 22 moves rearward while being lifted up through the drive mechanism 42. As a result, the movable plate 22 adopts the front-down inclined posture, and therefore, the visibility and the operability of the sub-display 24 are improved, and the vent hole 26 is open. Needless to say, also in the electronic apparatus 10B, the display chassis 14 can be further turned from the 90-degree position to the 180-degree position. It is to be noted that in the electronic apparatus 10B, the turning amount of the bridge portion 42*a* when the hinge chassis 34 has turned is larger than those of the electronic apparatuses 10 and 10A, and thus the rearward sliding amount of the movable plate 22 is also large. Therefore, the slide support portion 40*b* is configured to be longer in the front-rear direction than the slide support portions 40*b* of the electronic apparatuses 10 and 10A.

IV. Description of Electronic Apparatus According to Second Embodiment

Figure 6A:
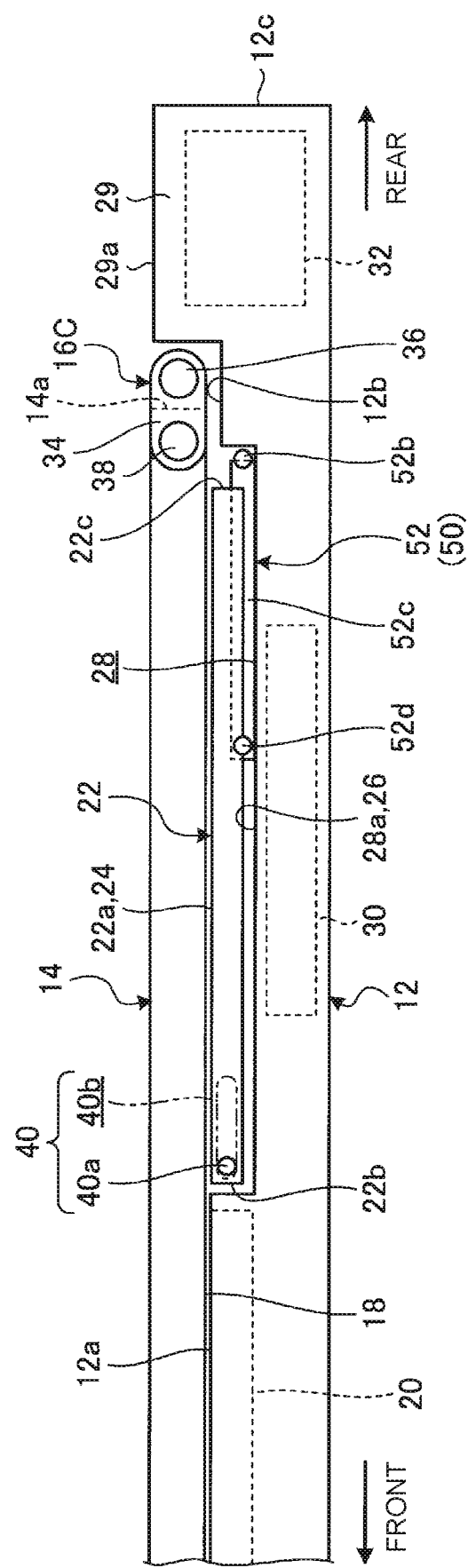
FIG. 6A is a side view showing a state where a display chassis of an electronic apparatus according to a second embodiment is in the 0-degree position.
Figure 6B:
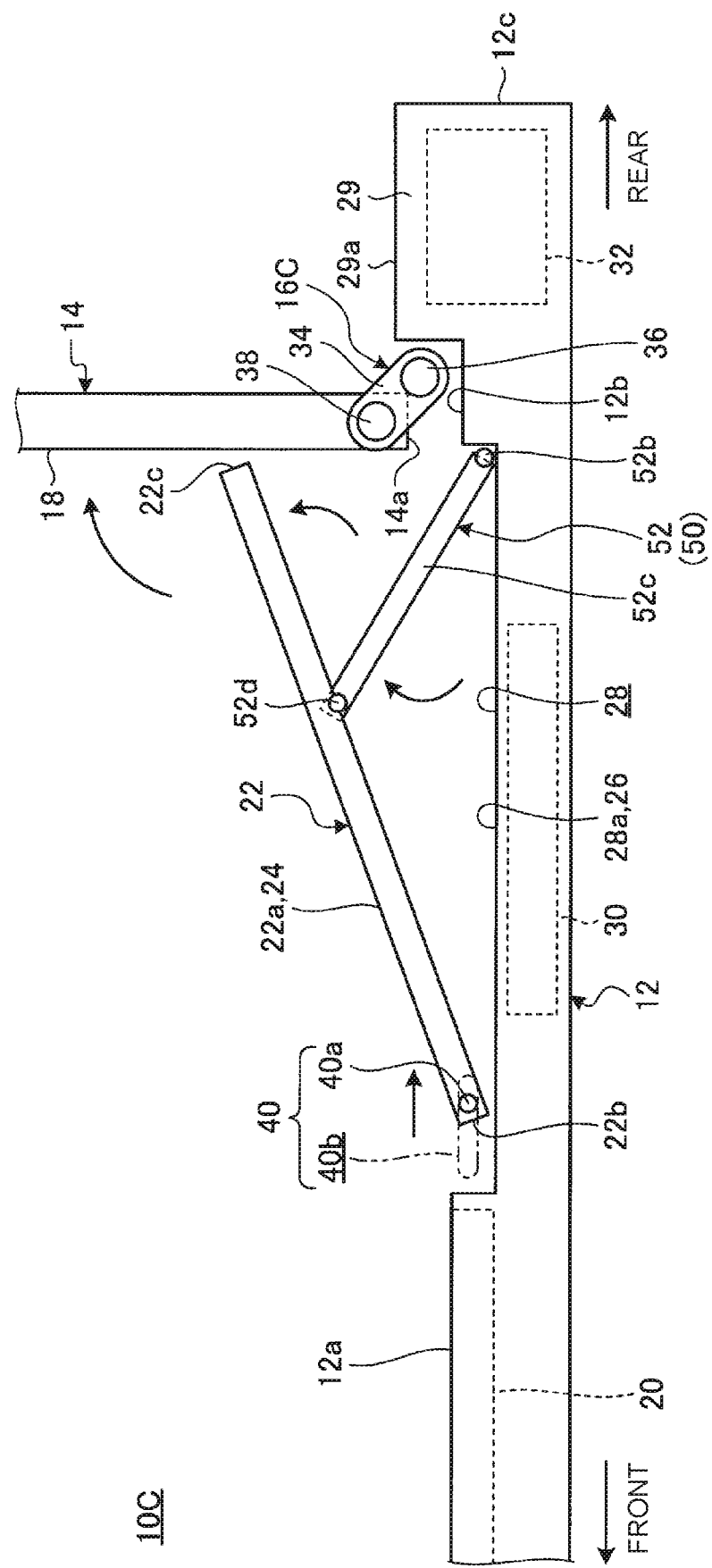
FIG. 6B is a side view showing a state where the display chassis shown in FIG. 6A is in the 90-degree position.
Figure 6C:
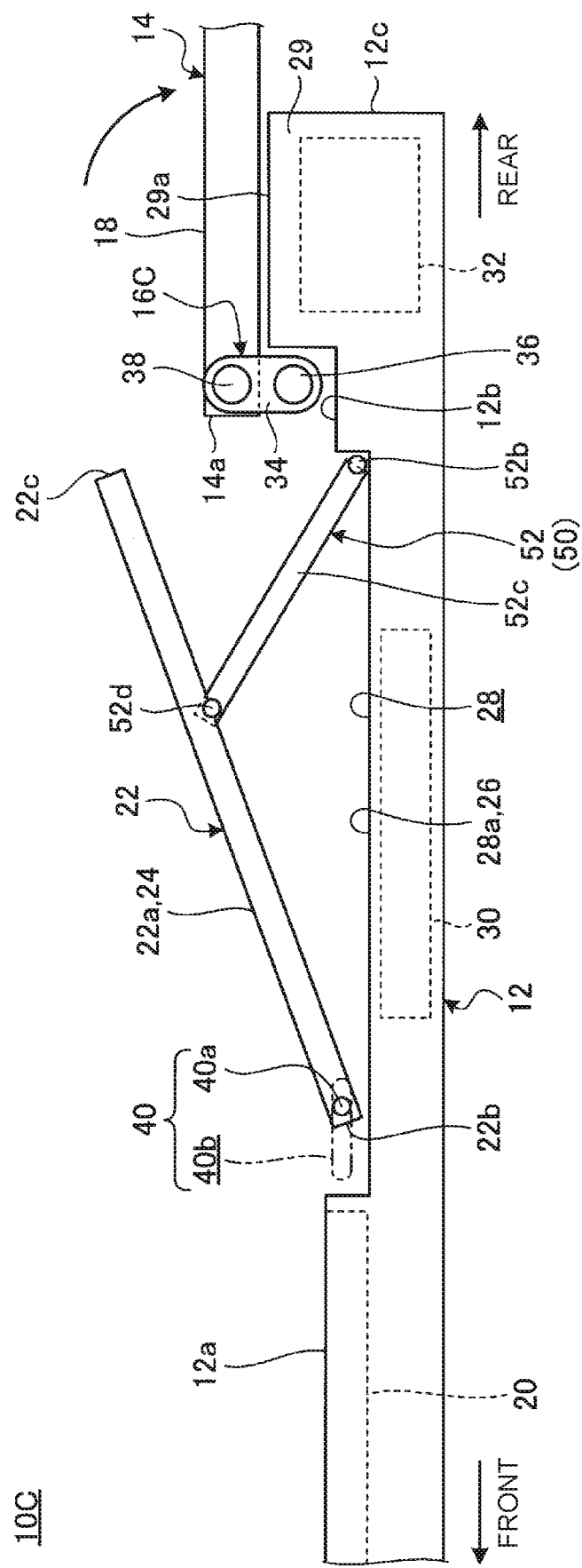
FIG. 6C is a side view showing a state where the display chassis shown in FIG. 6B is in the 180-degree position.
Figure 7:
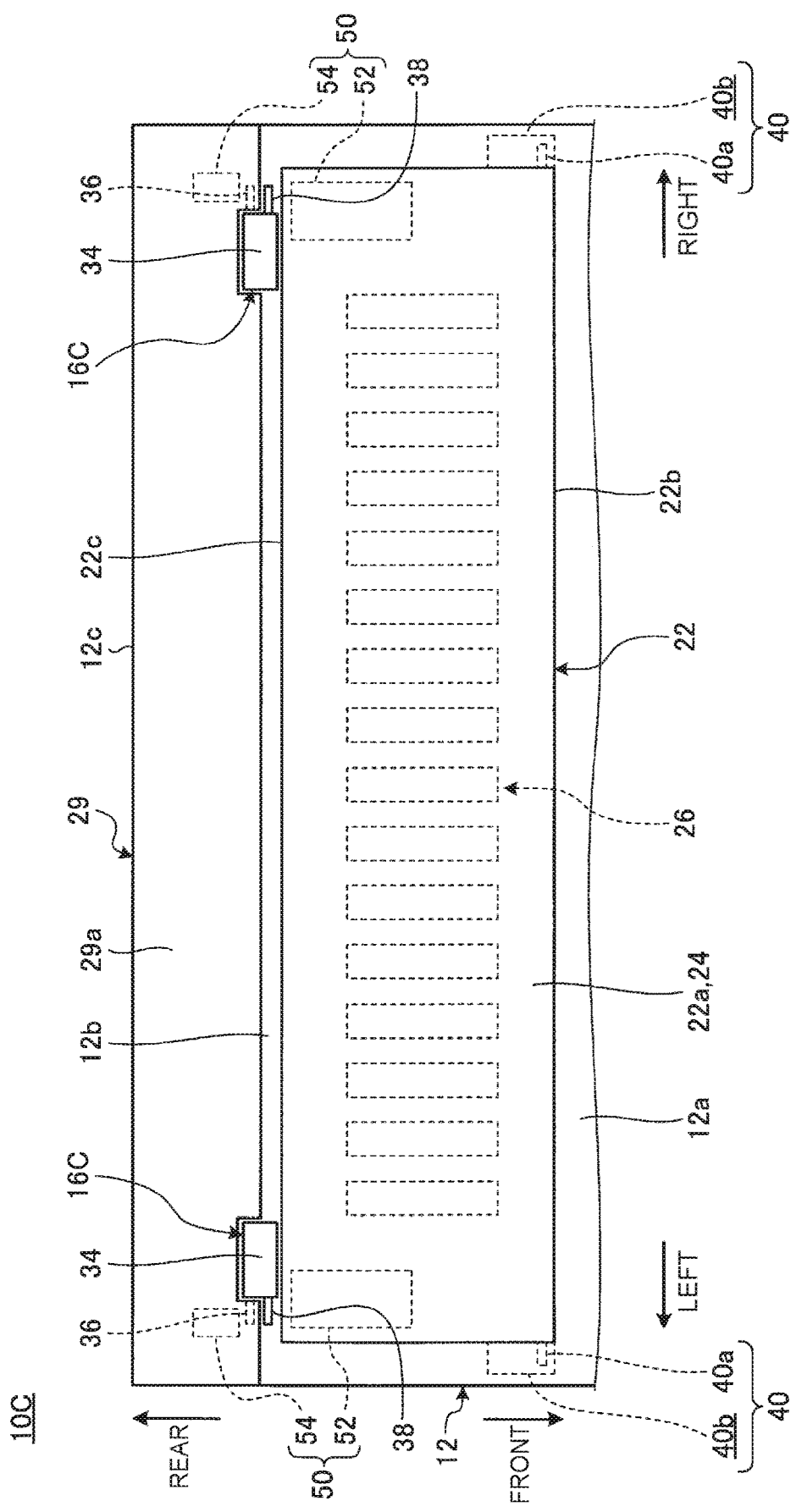
FIG. 7 is a plan view of a movable plate and its surroundings of the electronic apparatus shown in FIG. 6A.

FIGS. 6A to 6C are side views schematically showing the opening/closing motion of the display chassis 14 and the movable plate 22 with respect to the main body chassis 12 in the electronic apparatus 10C according to a second embodiment. FIG. 7 is a schematic plan view of the movable plate 22 and its surroundings of the electronic apparatus 10C shown in FIG. 6A. In the electronic apparatus 10C according to the second embodiment, a component having the same or similar function and effect as that of the electronic apparatus 10 according to the first embodiment is assigned the same reference numeral, and detailed description is omitted. The same applies to the electronic apparatus 10D described later.

The electronic apparatus 10C according to the present embodiment differs from the above-described electronic apparatus 10 according to the first embodiment in that the electronic apparatus 10C includes a hinge mechanism 16C having a different configuration from the hinge mechanism 16 and a drive mechanism 50 having a different configuration from the drive mechanism 42. The drive mechanism 50 is configured to not include the bridge portion 42a. Thus, the hinge mechanism 16C includes the hinge chassis 34 not provided with the bridge portion 42a. It is to be noted that the hinge mechanism 16C has a similar configuration to the above-described hinge mechanism 16, except that the hinge chassis 34 is not provided with the bridge portion 42a.

As shown in FIGS. 6A to 7, the drive mechanism 50 includes a lifting member 52 and a link mechanism 54. The lifting member 52 is a member that lifts up the movable plate 22 in response to a motion of the link mechanism 54. The link mechanism 54 is a mechanism that operates in conjunction with a rotating motion of the main body shaft 36 of the hinge mechanism 16C and drives the lifting member 52. FIG. 7 shows an example of a configuration where the right and left hinge mechanisms 16C and the right and left drive mechanisms 50 both have a bilaterally symmetrical structure; however, each of the right and left hinge mechanisms 16C and the right and left drive mechanisms 50 may have the same structure. Furthermore, the drive mechanism 50 may be provided only in either one of the right and left hinge mechanisms 16C. However, the turning motion and the stability of the movable plate 22 improve if the right and left hinge mechanisms 16C are both provided with the drive mechanism 50.

Figure 8:
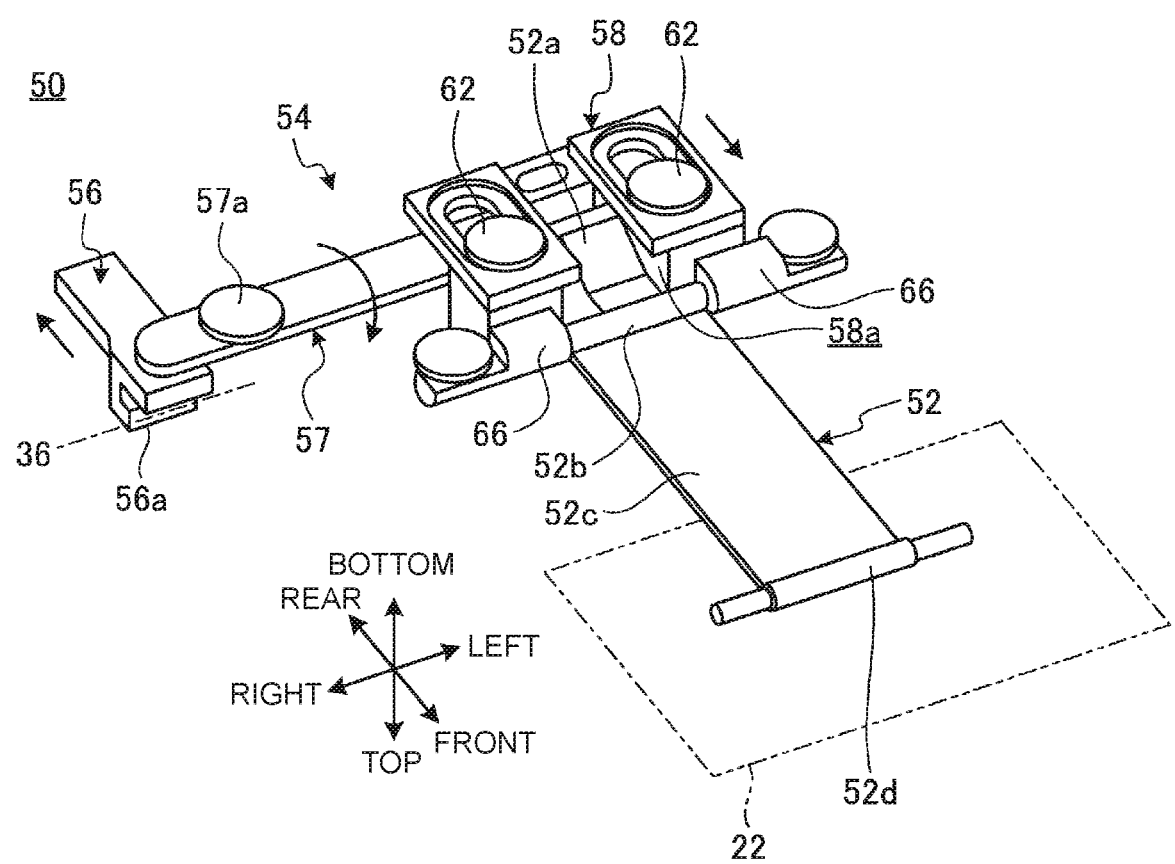
FIG. 8 is a bottom perspective view of an example of a drive mechanism included in the electronic apparatus shown in FIG. 6A.
Figure 9A:
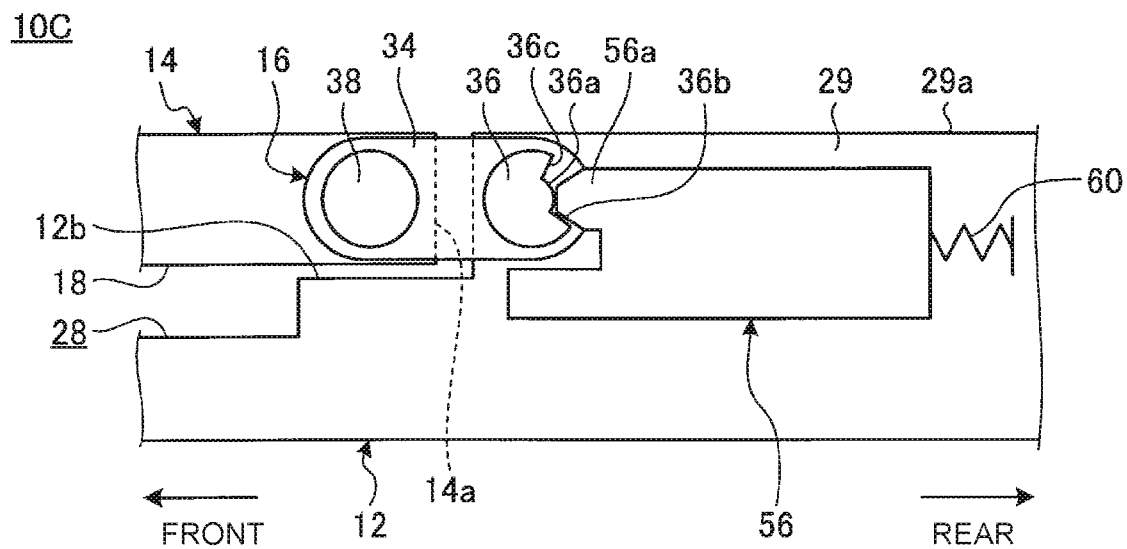
FIG. 9A is a side view showing a state of a main body shaft and a link mechanism when the display chassis is in the 0-degree position.
Figure 9B:
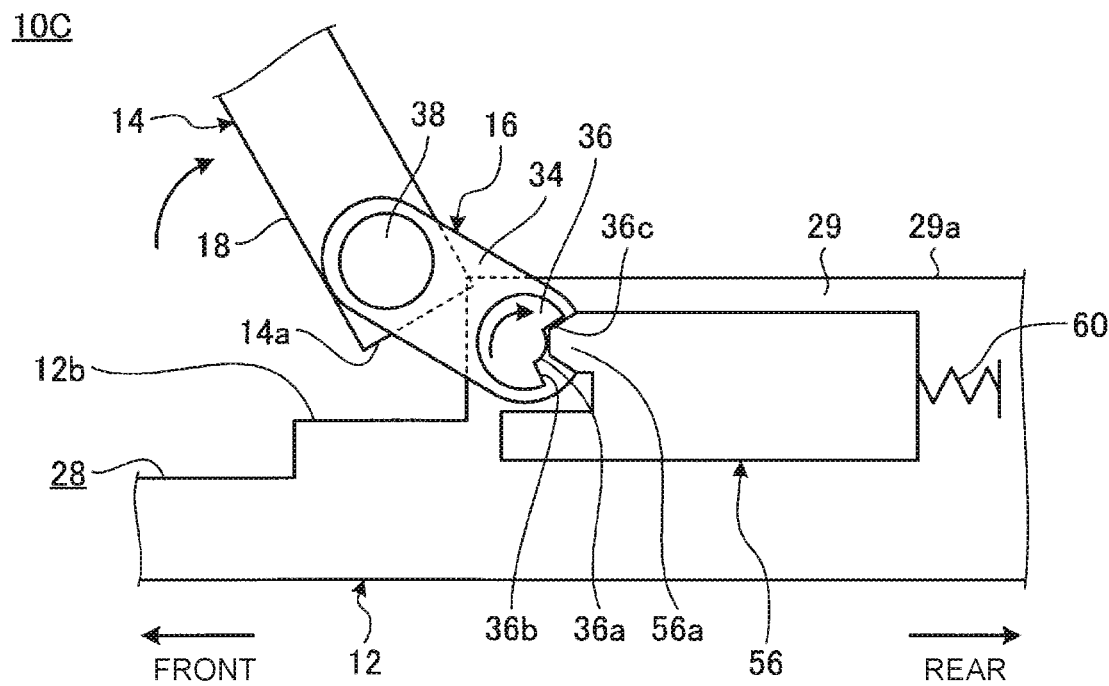
FIG. 9B is a side view showing a state of the main body shaft and the link mechanism when the display chassis shown in FIG. 9A is in a 60-degree position.
Figure 9C:
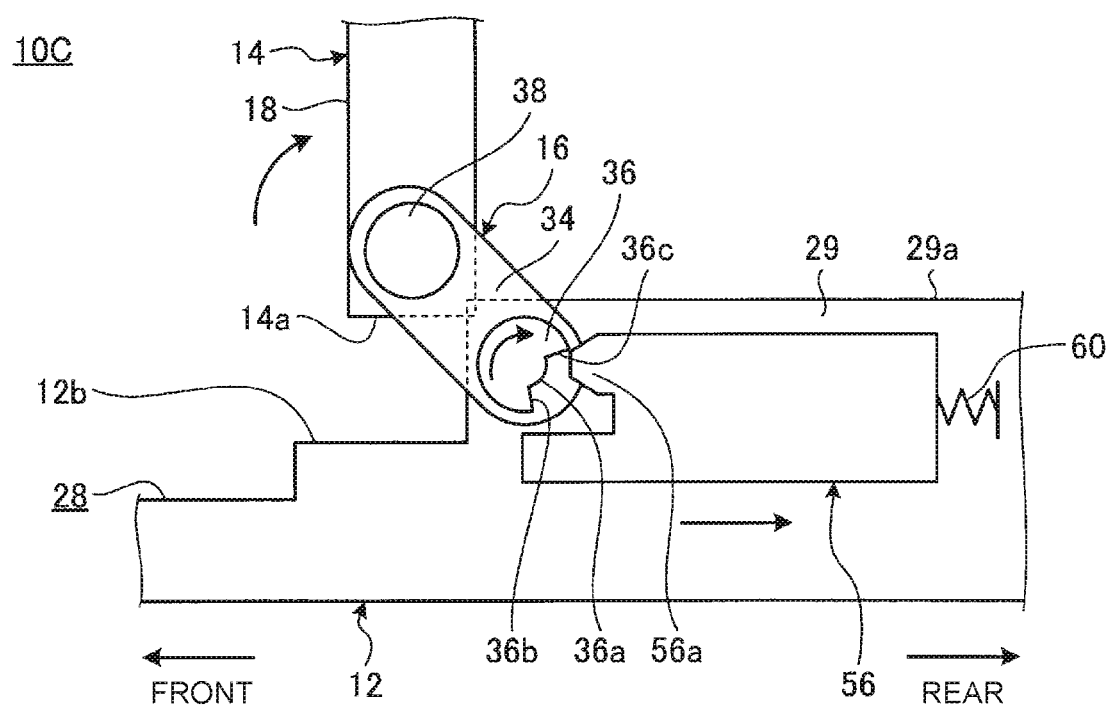
FIG. 9C is a side view showing a state of the main body shaft and the link mechanism when the display chassis shown in FIG. 9B is in the 90-degree position.
Figure 10A:
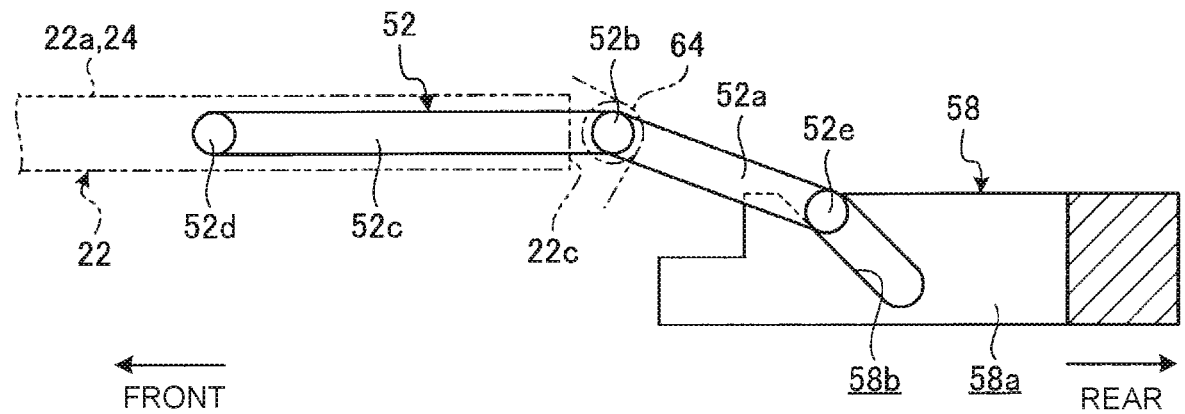
FIG. 10A is a side view showing a state of the link mechanism and a lifting member when the display chassis is in the 0-degree position.
Figure 10B:
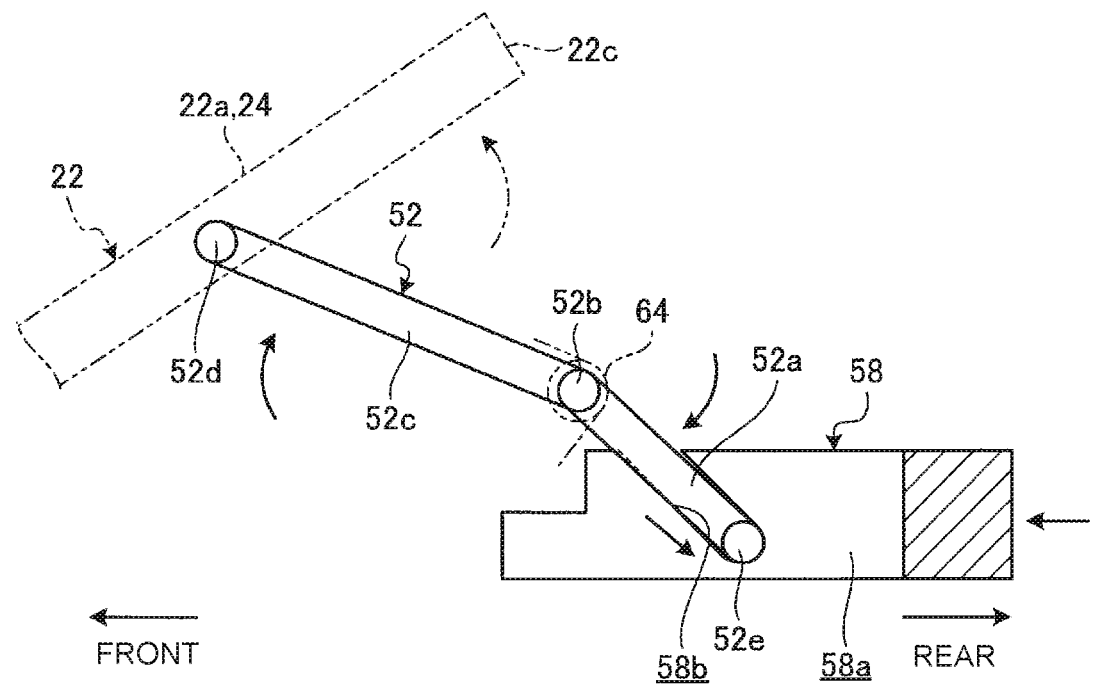
FIG. 10B is a side view showing a state of the link mechanism and the lifting member when the display chassis is set in the 90-degree position from the state shown in FIG. 10A.

FIG. 8 is a perspective view showing a configuration example of the drive mechanism 50, and is a diagram of the drive mechanism 50 viewed from below in a case where the display chassis 14 is in the 0-degree position. FIGS. 9A to 9C are side views schematically showing the interlocking operation of the main body shaft 36 and the link mechanism 54. FIGS. 10A and 10B are side views schematically showing a mechanism for the link mechanism 54 to drive the lifting member 52.

As shown in FIG. 7, the link mechanism 54 is provided in and near the extended portion 29 in the main body chassis 12. As shown in FIG. 8, the link mechanism 54 includes a link slider 56, a link arm 57, and a drive slider 58. The link mechanism 54 is, for example, attached to the back of the top surface 29a of the extended portion 29.

As shown in FIGS. 9A to 9C, the link slider 56 is a plate-like member that is supported by the main body chassis 12 so that the link slider 56 can slide in the front-rear direction. A front end of the link slider 56 is bifurcated and is composed of upper and lower two portions; the upper portion has a projecting piece 56a that projects forward. The link slider 56 is always biased toward the front by a biasing force of an elastic member 60, such as a coil spring. Thus, the tip of the projecting piece 56a is slidably in contact with a cam surface 36a of the main body shaft 36. One end of the link arm 57 is connected to an undersurface of the front end of the link slider 56 so that the link arm 57 can rotate and relatively move along an extending direction of the link arm 57.

Here, a mechanism for the cam surface 36a to press the link slider 56 is described. First, as shown in FIG. 9A, in a case where the display chassis 14 is in the 0-degree position, the projecting piece 56a enters the cam surface 36a that is a recess made in a portion of the outer circumferential surface of the main body shaft 36. In this state, the tip of the projecting piece 56a is in contact with a bottom surface of the cam surface 36a, and one side surface of the projecting piece 56a is in contact with one side wall surface 36b of the cam surface 36a.

If the display chassis 14 is opened from the 0-degree position to a 60-degree position shown in FIG. 9B, the main body shaft 36 rotates by 30 degrees in a clockwise direction in the drawing. During that time, the cam surface 36a does not press, i.e., misses the projecting piece 56a. In this state, the projecting piece 56a is in a position in which the other side surface is in contact with the other side wall surface 36c of the cam surface 36a.

If the display chassis 14 is opened from the 60-degree position to the 90-degree position shown in FIG. 9C, the main body shaft 36 further rotates by 15 degrees in the clockwise direction in the drawing. During that time, the side wall surface 36c of the cam surface 36a is in sliding contact with and presses the projecting piece 56a rearward, and, when the display chassis 14 comes in the 90-degree position, the projecting piece 56a gets over the side wall surface 36c and comes in contact with the outer circumferential surface of the main body shaft 36. Thus, the link slider 56 slides to the rear by an amount corresponding to the height of the side wall surface 36c against the biasing force of the elastic member 60.

It is to be noted that when the display chassis 14 is further opened from the 90-degree position, the projecting piece 56a is in sliding contact with the outer circumferential surface of the main body shaft 36, and thus the link slider 56 does not move. Furthermore, when the display chassis 14 is closed from the 90-degree position, while the display chassis 14 is closed from the 90-degree position to the 60-degree position, the projecting piece 56a slides off the side wall surface 36c, and thus the link slider 56 slides forward, and, while the display chassis 14 is further closed from the 60-degree position to the 0-degree position, the link slider 56 does not move.

To return to FIG. 8, the link arm 57 is a band plate-like member that extends along a substantially right-left direction in a state where the display chassis 14 is in the 0-degree position. One end of the link arm 57 is connected to the link slider 56 so that the link arm 57 can rotate and relatively move along the extending direction of the link arm 57, and the other end is connected to the drive slider 58 so that the link arm 57 can rotate and relatively move along the extending direction of the link arm 57. The link arm 57 is rotatably supported by the main body chassis 12 through a rotating shaft 57a. The rotating shaft 57a is connected to a position on the side closer to the link slider 56 than to the center of the link arm 57 in a longer direction. For example, if the link slider 56 slides rearward from the state shown in FIG. 8, the link arm 57 rotates in the clockwise direction in the drawing and presses the drive slider 58 forward.

As shown in FIGS. 8 and 10A, the drive slider 58 is formed into a substantially U-shape in plan view, and has a recessed portion 58a, which is open to the front, on the middle in the right-left direction. A passive portion 52a of the lifting member 52 is provided in the recessed portion 58a. A guide pin 62 is slidably inserted into a long hole in the front-rear direction formed on each of right and left portions of the drive slider 58. Thus, the drive slider 58 is supported by the main body chassis 12 so that the drive slider 58 can slide in the front-rear direction.

As shown in FIGS. 8, 10A, and 10B, the lifting member 52 has, in the order from the rear to the front, the band plate-like passive portion 52a, a pin-like turning shaft 52b, a band plate-like driving portion 52c, and a pin-like driving shaft 52d.

The turning shaft 52b of the lifting member 52 is rotatably supported by the main body chassis 12. The lifting member 52 moves up and down centering on the turning shaft 52b like a seesaw, and the passive portion 52a and the driving portion 52c move up and down in directions opposite to each other. For example, the turning shaft 52*b* of the lifting member 52 is provided with an elastic member 64, such as a helical torsion coil spring. The elastic member 64 always biases the passive portion 52*a* to move up and the driving portion 52*c* to move down. In a state where the display chassis 14 is in the 0-degree position, in the lifting member 52, the driving portion 52*c* adopts a horizontal posture along the front-rear direction, and the passive portion 52*a* adopts a rear-down inclined posture (see FIGS. 8 and 10A).

The passive portion 52*a* is a plate-like part that is inserted into the recessed portion 58*a* of the drive slider 58 from the front, and is pressed by the drive slider 58, thereby moving up and down. If the passive portion 52*a* is pressed by the drive slider 58 slid to the front, the passive portion 52*a* turns downward centering on the turning shaft 52*b* (see FIG. 10B). If the drive slider 58 slides rearward, and the passive portion 52*a* is released from a pressing force, the passive portion 52*a* is subjected to the biasing force of the elastic member 64 and turns upward centering on the turning shaft 52*b*.

The passive portion 52*a* has two guide pins 52*e* that project from right and left side surfaces of the passive portion 52*a*, respectively (see FIGS. 10A and 10B). The guide pins 52*e* are slidably inserted into rear-down inclined guide holes 58*b* formed on right and left side surfaces of the recessed portion 58*a* of the drive slider 58. Therefore, if the drive slider 58 slides to the front, the guide pins 52*e* move down while sliding in the respective guide holes 58*b*. It is to be noted that the structure of the drive slider 58 pressing the passive portion 52*a* is not limited; for example, a rear-down inclined surface may be provided on a rear surface of the recessed portion 58*a* of the drive slider 58 so that this inclined surface is configured to press the passive portion 52*a*.

The turning shaft 52*b* is a pin-like part integrally formed between the passive portion 52*a* and the driving portion 52*c*. The turning shaft 52*b* projects outward from right and left side surfaces of the driving portion 52*c*, and is rotatably supported by bearings 66 supported by the main body chassis 12.

The driving portion 52*c* is a plate-like part with the driving shaft 52*d* integrally formed on the distal end thereof. The driving portion 52*c* is subjected to the biasing force of the elastic member 64 and is always biased to move down centering on the turning shaft 52*b*. The driving shaft 52*d* is a pin-like part integrally formed on the distal end of the driving portion 52*c*. The driving shaft 52*d* is relatively rotatably connected to an undersurface of the movable plate 22.

Therefore, when the passive portion 52*a* is pressed by the drive slider 58 slid to the front and goes down, with this, the driving portion 52*c* is lifted up, and the lifting member 52 pushes the movable plate 22 up through the driving shaft 52*d* provided on its distal end. On the other hand, if the drive slider 58 slides to the rear, and the passive portion 52*a* is released from the pressing force, the driving portion 52*c* goes down by the biasing force of the elastic member 64, and the lifting member 52 pushes the movable plate 22 down.

Next, the operation of the electronic apparatus 10C according to the present embodiment is described.

First, in the 0-degree position in which the display chassis 14 is closed on the top surface 12*a* of the main body chassis 12, as shown in FIG. 6A, the main body shaft 36 and the display shaft 38 are aligned in the front-rear direction, and the hinge chassis 34 adopts the 0-degree posture, i.e., the hinge chassis 34 lies down. In this state, the link mechanism 54 is in an initial position in which the link slider 56 has moved forward (see FIG. 9A), and the drive slider 58 is in an initial position in which the drive slider 58 has moved rearward (see FIG. 10A). Thus, the drive mechanism 50 sets the driving portion 52*c* of the lifting member 52 in the horizontal posture shown in FIG. 10A. As a result, the movable plate 22 is housed in the storage recessed portion 28 in the horizontal posture along the front-rear direction.

While the display chassis 14 is opened from the 0-degree position to the 60-degree position shown in FIG. 9B, the cam surface 36*a* does not press the projecting piece 56*a* of the link slider 56. Thus, the drive mechanism 50 does not operate, and the movable plate 22 is maintained in the 0-degree posture.

While the display chassis 14 is opened from the 60-degree position to the 90-degree position shown in FIGS. 6B and 9C, the link slider 56 is pushed rearward through the side wall surface 36*c* of the cam surface 36*a*. Thus, in the drive mechanism 50, the link mechanism 54 operates and drives the lifting member 52. That is, the link arm 57 rotates, and the drive slider 58 slides to the front, and thereby the passive portion 52*a* of the lifting member 52 is pushed down, and at the same time, the driving portion 52*c* is pushed up (see FIG. 10B). As a result, the rear end 22*c* of the movable plate 22 moves upward while moving to the rear with the rotating shaft 40 of the front end 22*b* as the turning center, and the movable plate 22 adopts the front-down inclined posture (see FIG. 6B).

It is to be noted that while the display chassis 14 is further opened from the 90-degree position to the 180-degree position shown in FIG. 6C, the projecting piece 56*a* is in sliding contact with the outer circumferential surface of the main body shaft 36, and thus the link slider 56 does not move. Therefore, the drive mechanism 50 does not operate, and the movable plate 22 is maintained in the same posture as the inclined posture at the 90-degree position.

In this way, the electronic apparatus 10C also includes the drive mechanism 50, and thus the movable plate 22 turns in conjunction with a turning motion of the display chassis 14, and, when the electronic apparatus 10C is used, the movable plate 22 automatically adopts the front-down inclined posture. Therefore, the visibility and the operability of the sub-display 24 are improved, and the vent hole 26 is open.

Furthermore, the electronic apparatus 10C according to the present embodiment also includes a time lag mechanism that causes the movable plate 22 to not turn until the display chassis 14 comes to the 60-degree position even if a turning motion of the display chassis 14 is started. Thus, it is possible to prevent a situation where the movable plate 22 interferes with the display chassis 14 when the display chassis 14 is opened from the 0-degree position, and the display chassis 14 cannot make a turning motion smoothly. Moreover, the hinge mechanism 16C and the drive mechanism 50 in the present embodiment can easily change the time lag in the turning of the display chassis 14 and the movable plate 22 by adjusting the timing for the cam surface 36*a* of the main body shaft 36 to press the projecting piece 56*a* of the link slider 56.

Furthermore, in the electronic apparatus 10C according to the present embodiment, the turning angle of the display chassis 14 with the movable plate 22 inclined at the maximum angle can be easily set by adjusting the timing for the cam surface 36*a* of the main body shaft 36 to press the projecting piece 56*a* of the link slider 56. In the above description, for example, the movable plate 22 is configured to be inclined at the maximum angle when the display chassis 14 is in the 90-degree position, and thereby it is possible to maximize the visibility and the operability of the sub-display 24 over a wide angular range from the 90-degree position to the 180-degree position, and is possible to maximize the open amount of the vent hole 26.

It is to be noted that the motion when the display chassis 14 being in the 180-degree position shown in FIG. 6C is turned in the closing direction is the opposite way around to the above-described opening motion. That is, when the display chassis 14 is turned in the closing direction, while the display chassis 14 is closed from the 90-degree position to the 0-degree position, the movable plate 22 gradually moves forward while the rear end 22c goes down, and, when the display chassis 14 comes to the 0-degree position, the electronic apparatus 10C is again back to the initial state shown in FIG. 6A.

V. Description of Electronic Apparatus According to Third Embodiment

Figure 11A:
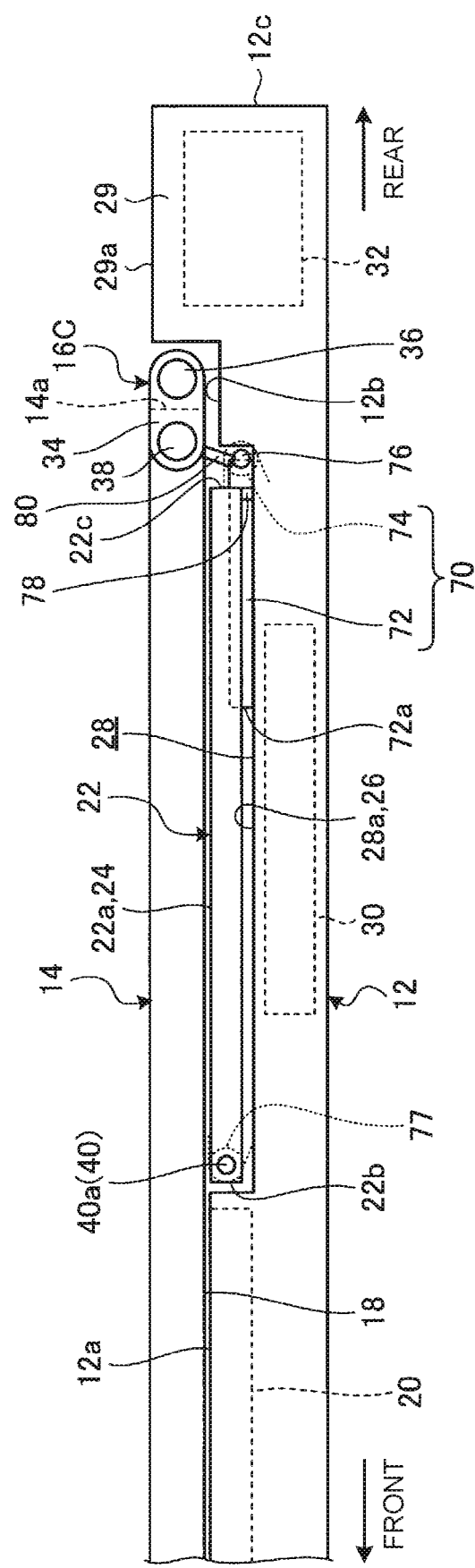
FIG. 11A is a side view showing a state where a display chassis of an electronic apparatus according to a third embodiment is in the 0-degree position.
Figure 11B:
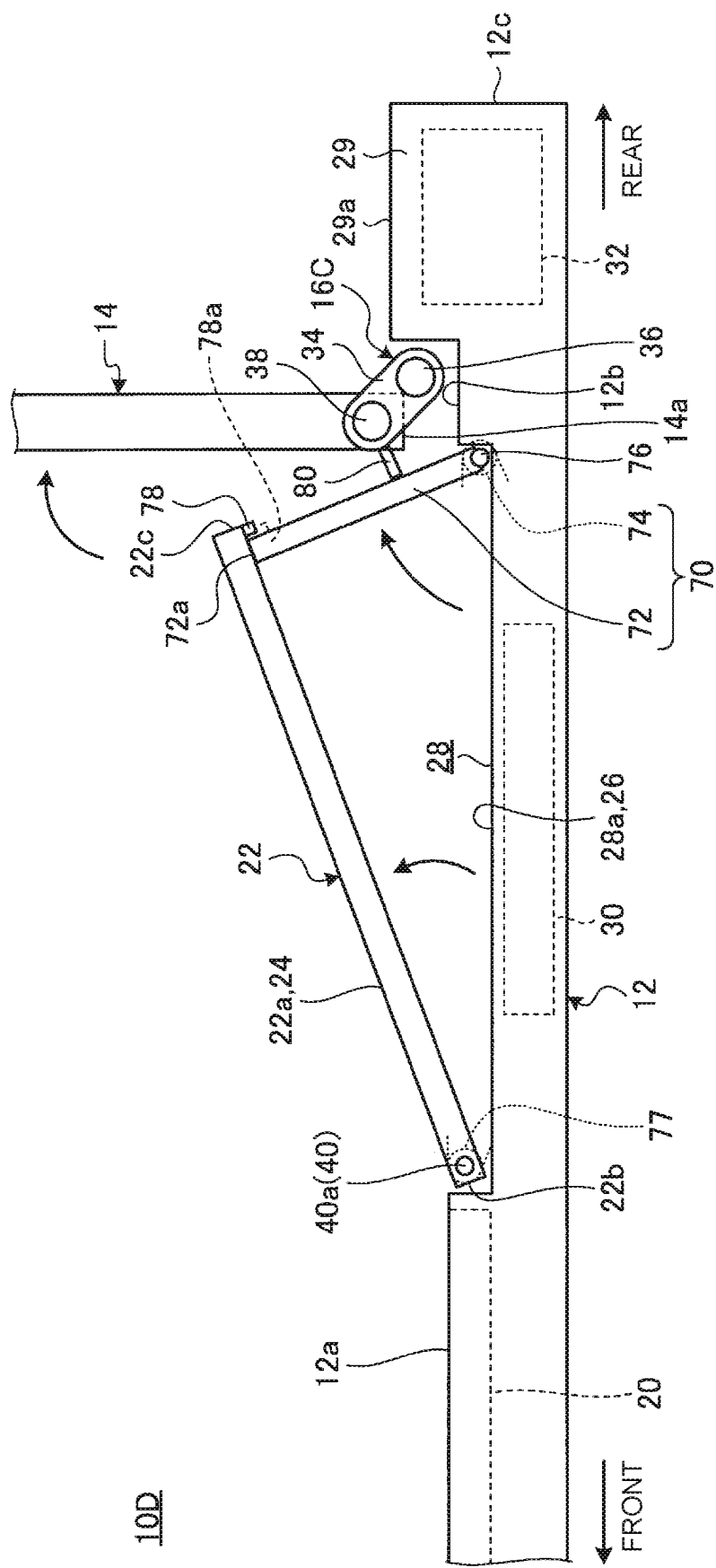
FIG. 11B is a side view showing a state where the display chassis shown in FIG. 11A is in the 90-degree position.
Figure 12:
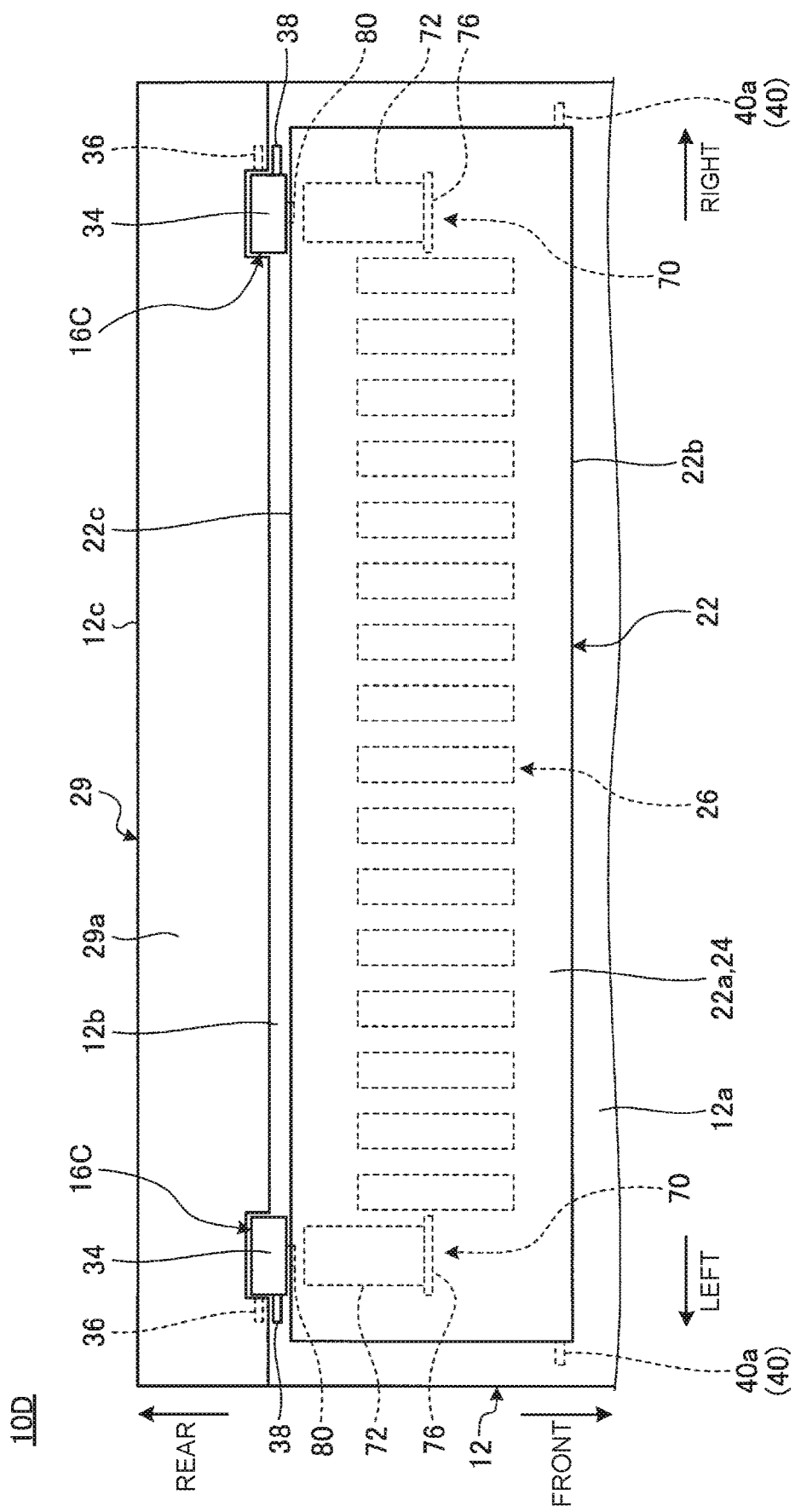
FIG. 12 is a plan view of a movable plate and its surroundings of the electronic apparatus shown in FIG. 11A.

FIGS. 11A and 11B are side views schematically showing the opening/closing motion of the display chassis 14 and the movable plate 22 with respect to the main body chassis 12 in the electronic apparatus 10D according to a third embodiment. FIG. 12 is a schematic plan view of the movable plate 22 and its surroundings of the electronic apparatus 10D shown in FIG. 11A.

The electronic apparatus 10D according to the present embodiment differs from the above-described electronic apparatus 10C according to the second embodiment in that the electronic apparatus 10D includes a drive mechanism 70 having a different configuration from the drive mechanism 50. As shown in FIGS. 11A to 12, the drive mechanism 70 includes a brace member 72 and an elastic member 74.

The brace member 72 is a band plate-like member extending in the front-rear direction; a pair of right and left brace members 72 is provided on the undersurface side of the movable plate 22. For example, one brace member 72 may be provided on the middle of the movable plate 22 in the right-left direction, or three or more brace members 72 may be provided. The brace member 72 has a turning shaft 76 on its rear end. The turning shaft 76 is rotatably connected to the main body chassis 12 in the storage recessed portion 28. Thus, the brace member 72 is connected to the main body chassis 12 so that the brace member 72 can turn in a direction in which a front end 72a moves up and down. In a state where the display chassis 14 is in the 0-degree position as shown in FIG. 11A, the turning shaft 76 in the rear end of the brace member 72 is disposed on the rear end of the storage recessed portion 28, and the front end 72a is disposed in a position that is slightly in the rear of the middle of the movable plate 22 in the front-rear direction.

The elastic member 74 is, for example, a helical torsion coil spring, and is attached to the turning shaft 76. The elastic member 74 always biases the brace member 72 in a direction of lifting the front end 72a up centering on the turning shaft 76.

The movable plate 22 of the electronic apparatus 10D is connected to the main body chassis 12 by the rotating shaft 40 having no slide support portions 40b. That is, the movable plate 22 of the electronic apparatus 10D has an attachment structure in which the front end 22b is turnably connected to the main body chassis 12 by the connecting shaft 40a, and does not slide in the front-rear direction. The connecting shaft 40a is provided with an elastic member 77 including, for example, a helical torsion coil spring. The elastic member 77 always biases the movable plate 22 in a direction of lifting the rear end 22c up centering on the connecting shaft 40a. The rear end 22c of the movable plate 22 or a portion near the rear end 22c is provided with a projection-like locking part 78 that projects to the undersurface side.

Next, the operation of the electronic apparatus 10D according to the present embodiment is described.

First, in the 0-degree position in which the display chassis 14 is closed on the top surface 12a of the main body chassis 12, as shown in FIG. 11A, the main body shaft 36 and the display shaft 38 are aligned in the front-rear direction, and the hinge chassis 34 adopts the 0-degree posture, i.e., the hinge chassis 34 lies down. In this state, a lifting force on the brace member 72 exerted by the biasing force of the elastic member 74 and a lifting force on the movable plate 22 exerted by the lifting force on the brace member 72 and the biasing force of the elastic member 77 are suppressed by the display chassis 14. Thus, the movable plate 22 is kept in the horizontal posture along the front-rear direction, and is housed in the storage recessed portion 28.

If the display chassis 14 is opened from the 0-degree position, with the turning of the display chassis 14, the movable plate 22 turns under an upward force exerted by a pressing force of the brace member 72 and the biasing force of the elastic member 77. If the display chassis 14 is in the 90-degree position shown in FIG. 11B, the front end 72a of the brace member 72 turned by the biasing force of the elastic member 74 comes vertically in contact with the undersurface of the movable plate 22. As a result, the brace member 72 serves as a brace that supports the movable plate 22 from below, and the front-down inclined posture of the movable plate 22 is stably kept. At this time, the front end 72a of the brace member 72 is locked by the locking part 78 of the movable plate 22, and thus further turning of the brace member 72 is restricted. Therefore, a holding state of the movable plate 22 held by the brace member 72 shown in FIG. 11B is stably maintained. At this time, for example, the locking part 78 may be provided with a hook 78a engageable with and disengageable from a hole (not shown) formed on the brace member 72 to restrict turning of the movable plate 22 in a lifting direction.

It is to be noted that while the display chassis 14 is further opened from the 90-degree position to the 180-degree position, the drive mechanism 70 does not operate. That is, the brace member 72 and the movable plate 22 do not operate, and the holding state shown in FIG. 11B is maintained. When the display chassis 14 is in the 180-degree position, the display chassis 14 and the hinge mechanism 16C are in a state similar to the case of the electronic apparatus 10C shown in FIG. 6C.

In this way, the electronic apparatus 10D also includes the drive mechanism 70, and thus the movable plate 22 turns in conjunction with a turning motion of the display chassis 14, and, when the electronic apparatus 10D is used, the movable plate 22 automatically adopts the front-down inclined posture. Therefore, the visibility and the operability of the sub-display 24 are improved, and the vent hole 26 is open. Furthermore, when the display chassis 14 is in the 90-degree position, the brace member 72 serves as a prop on the undersurface side of the movable plate 22, and thus the inclined posture of the movable plate 22 is further stabilized.

Incidentally, in the electronic apparatus 10D of the present embodiment, when the display chassis 14 is in the 90-degree position shown in FIG. 11B, a projection 80 provided on the external surface of the hinge chassis 34 in a projecting manner comes in contact with or close to a top surface of the brace member 72. Thus, if the display chassis 14 being in the 90-degree position shown in FIG. 11B is turned in the closing direction, the projection 80 of the hinge chassis 34 turning to the front together with the display chassis 14 presses the brace member 72. As a result, the brace member 72 is released from the support of the movable plate 22, and goes into a fit state to be brought down. Therefore, when the display chassis 14 is closed from the 90-degree position to the 0-degree position, the user only has to turn the display chassis 14 to bring the movable plate 22 and the brace member 72 down smoothly, and thus the display chassis 14 can be easily closed.

It is to be noted that needless to say, the present invention is not limited to the above-described embodiments, and various modifications may be made without departing from the scope of the invention.

In the above, there is described an example where the movable plate 22 is configured to include the sub-display 24; however, the sub-display 24 does not have to be provided. In this case, the movable plate 22 serves as an openable lid of the vent hole 26. Furthermore, the vent hole 26 may be omitted. In this case, the movable plate 22 serves as a support plate of the sub-display 24.

In the above, there are described the mechanical-type drive mechanisms 42, 50, and 70 as an example of a mechanism that gears the movable plate 22 to a turning motion of the display chassis 14. However, the drive mechanism may be configured to cause the movable plate 22 to be driven by an electric motor driven on the basis of, for example, a turning angle of the display chassis 14 and respective rotation angles of the shafts 36 and 38 detected by an angle sensor (not shown).

As has been described, the present invention provides an improved electronic apparatus that is user-friendly while without impairing its external appearance.

While the invention has been particularly shown and described with reference to a preferred embodiment, it will be understood by those skilled in the art that various changes in form and detail may be made therein without departing from the spirit and scope of the invention.

What is claimed is:

1. An electronic apparatus comprising:
   a first chassis having a keyboard device on a first surface;
   a second chassis having a display on a first surface;
   a movable plat disposed between said first and second chassis; and
   a hinge mechanism having a hinge chassis that connects said first chassis, said second chassis, and said movable plate to each other, wherein said hinge mechanism includes
      a drive mechanism that causes said movable plate to turn in conjunction with a turning motion of one of said first chassis and said second chassis through said hinge mechanism;
      a main body shaft that rotatably connects said hinge chassis to said first chassis to allow said first chassis to pivot in relation to said second chassis and said movable plate;
      a display shaft that rotatably connects said hinge chassis to said second chassis to allow said second chassis to pivot in relation to said first chassis and said movable plate and
      a drive shaft that rotatably connects said hinge chassis to said movable plate to allow said movable plate to pivot in relation to said first and second chassis.

2. The electronic apparatus of claim 1, wherein a sub-display is provided on a surface of said movable plate.

3. The electronic apparatus of claim 2, wherein said sub-display is smaller than said display.

4. The electronic apparatus of claim 1, wherein when said first chassis and said second chassis make a first angle at which said second chassis is closed on said first surface of said first chassis, said movable plate is in a first position in which said movable plate is disposed along said first surface of said first chassis.

5. The electronic apparatus of claim 4, wherein when at least said second chassis is opened from said first chassis, and said first chassis and said second chassis make a second angle larger than said first angle, said movable plate is in a second position in which said rear end is lifted up from said first surface of said first chassis.

6. The electronic apparatus of claim 1, wherein said first chassis includes a vent hole on a portion opened or closed in accordance with a turning motion of said movable plate, wherein said vent hole allows air to circulate inside and outside of said first chassis.

7. The electronic apparatus of claim 1, wherein said drive mechanism includes
   a link mechanism that operates in conjunction with a rotating motion of said first hinge shaft; and
   a lifting member whose one end is provided with a drive shaft that is relatively rotatably connected to an under-surface of said movable plate, and another end is provided with a passive portion that is subjected to a motion of said link mechanism, and a position of the lifting member between the one end and the other end being turnably connected to the first chassis through a turning shaft, and
   when said passive portion is subjected to said motion of said link mechanism, said lifting member moves in a direction of lifting said one end up from said top surface of said first chassis, thereby pushing up said rear end of said movable plate.

8. The electronic apparatus of claim 7, wherein
   said one end of said lifting member is located further forward than said other end, and thereby said other end is disposed in a position closer to said first hinge shaft than said one end, and
   said drive shaft is connected to said under-surface of said movable plate at a position between said front end and said rear end of said movable plate.

9. The electronic apparatus of claim 1, further comprising a time lag mechanism that causes,
   when said second chassis is closed on said top surface of said first chassis, said second chassis is caused to make a turning motion by said hinge mechanism,
   after said turning motion of said second chassis has started, said movable plate to make a turning motion with a delay from said turning motion.

10. An electronic apparatus, comprising:
    a first chassis having a keyboard device on a first surface;
    a second chassis having a display on a first surface;
    a hinge mechanism connects said first chassis to said second chassis, wherein said hinge mechanism includes
       a hinge chassis provided to stretch between said first and second chassis;
       a first hinge shaft rotatably connects between said first chassis and said hinge chassis;
       a bridge portion provided to be turnable together with said hinge chassis through said first hinge shaft, and is provided to stretch between said rear end of said movable plate and said hinge chassis; and
       a drive shaft rotatably connects between said rear end of said movable plate and said bridge portion;
    a movable plate, disposed adjacent to said keyboard device on said first surface of said first chassis, to be turnable in a direction of moving a rear end up and down centering on a rotating shaft provided on a front end; and a drive mechanism causes said movable plate to turn in conjunction with a turning motion of said first chassis and said second chassis through said hinge mechanism.

11. The electronic apparatus of claim 10, wherein said hinge mechanism further includes a second hinge shaft that rotatably connects between said second chassis and said hinge chassis, wherein said second hinge shaft is disposed in a position between said first hinge shaft and said drive shaft.

12. The electronic apparatus of claim 11, wherein said first chassis has an extended portion that projects further rearward than said hinge mechanism in rear of said movable plate on said first surface.

13. The electronic apparatus of claim 12, wherein said first hinge shaft is disposed lower than a top surface of said extended portion; and said second hinge shaft moves from a position lower than the top surface of said extended portion to a position higher than said top surface of said extended portion in accordance with a turning motion of said hinge chassis.

14. An electronic apparatus, comprising:

a first chassis having a keyboard device on a first surface;

a second chassis having a display on a first surface;

a hinge mechanism connects said first chassis to said second chassis;

a movable plate, disposed adjacent to said keyboard device on said first surface of said first chassis, to be turnable in a direction of moving a rear end up and down centering on a rotating shaft provided on a front end, wherein said rotating shaft includes a connecting shaft that relatively rotatably connects between said front end of said movable plate and said first chassis; and a slide support portion that slidably supports said connecting shaft along said top surface of the first chassis; and a drive mechanism causes said movable plate to turn in conjunction with a turning motion of said first chassis and said second chassis through said hinge mechanism.

15. An electronic apparatus comprising:

a first chassis having a keyboard device on a first surface;

a second chassis having a display on a first surface;

a movable plat disposed between said first and second chassis; and a hinge mechanism having a hinge chassis that connects said first chassis, said second chassis, and said movable plate to each other, wherein said hinge mechanism includes a drive mechanism that causes said movable plate to turn in conjunction with a turning motion of one of said first chassis and said second chassis through said hinge mechanism, wherein said drive mechanism includes a brace member provided on a side of an undersurface of said movable plate, one end of said brace member being rotatably connected to said first chassis; and an elastic member that biases said brace member in a direction of lifting another end of said brace member up from said top surface of said first chassis with the one end as a turning center; and said other end of said brace member is in contact with said undersurface of said movable plate with said rear end of said movable plate lifted up.

16. The electronic apparatus of claim 15, wherein said movable plate includes a locking part that locks said other end of said brace member.

17. The electronic apparatus of claim 15, wherein said second chassis or said hinge mechanism includes a projection that, when said hinge mechanism causes said second chassis to make a closing motion with respect to said first chassis, presses said brace member with said other end in contact with said movable plate against a biasing force of said elastic member.

* * * * *